(12) United States Patent
Ishiyama et al.

(10) Patent No.: US 7,396,425 B2
(45) Date of Patent: Jul. 8, 2008

(54) METHOD OF PRODUCTION OF PEELING LAYER PASTE AND METHOD OF PRODUCTION OF MULTILAYER TYPE ELECTRONIC DEVICE

(75) Inventors: Tamotsu Ishiyama, Chuo-ku (JP); Shigeki Sato, Chuo-ku (JP)

(73) Assignee: TDK Corporation, Tokyo (JP)

( * ) Notice: Subject to any disclaimer, the term of this patent is extended or adjusted under 35 U.S.C. 154(b) by 533 days.

(21) Appl. No.: 11/206,798

(22) Filed: Aug. 19, 2005

(65) Prior Publication Data

US 2006/0037690 A1  Feb. 23, 2006

(30) Foreign Application Priority Data

Aug. 20, 2004  (JP) .............. 2004-240828

(51) Int. Cl.
  *C03B 29/00* (2006.01)
  *H01G 4/30* (2006.01)
(52) U.S. Cl. ............ 156/89.12; 156/89.16; 156/289; 501/1; 501/94
(58) Field of Classification Search ........ 156/89.12, 156/89.16, 289; 241/16; 501/1, 94
  See application file for complete search history.

(56) References Cited

U.S. PATENT DOCUMENTS

| | | | |
|---|---|---|---|
| 6,511,564 B2 * | 1/2003 | Nakamura et al. | 156/89.16 |
| 6,579,394 B1 * | 6/2003 | Nakamura et al. | 156/89.12 |
| 6,790,907 B2 * | 9/2004 | Takata et al. | 524/833 |
| 2005/0143253 A1 * | 6/2005 | Na et al. | 501/103 |
| 2006/0035071 A1 * | 2/2006 | Ishiyama et al. | 428/325 |
| 2006/0280933 A1 * | 12/2006 | Kobayashi et al. | 428/325 |
| 2007/0190251 A1 * | 8/2007 | Abe et al. | 427/258 |

FOREIGN PATENT DOCUMENTS

| | | | |
|---|---|---|---|
| JP | A 63-51616 | | 3/1988 |
| JP | A 03-250612 | | 11/1991 |
| JP | A 07-312326 | | 11/1995 |
| JP | 2001-039773 | * | 2/2001 |
| JP | 2001-106578 | * | 4/2001 |
| JP | B2 3387455 | | 1/2003 |
| JP | A 2003-197457 | | 7/2003 |
| JP | 2005-089200 | * | 4/2005 |
| JP | 2005-104070 | * | 4/2005 |
| WO | 2005/026077 | * | 3/2005 |

* cited by examiner

*Primary Examiner*—Melvin C Mayes
(74) *Attorney, Agent, or Firm*—Oliff & Berridge, PLC

(57) ABSTRACT

A method of production of peeling layer paste used for producing a multilayer electronic device, having a step of preparing a primary slurry containing a ceramic powder having an average particle size of 0.1 pm or less, a binder, and a dispersion agent and having a nonvolatile concentration of 30 wt % or more, a step of adding to the primary slurry a binder-lacquer solution to dilute the primary slurry to prepare a secondary slurry having a nonvolatile concentration of 15 wt % or less and a content of the binder of 12 parts by weight or more with respect to 100 parts by weight of the ceramic powder, and a high pressure dispersion treatment step of running the secondary slurry through a wet jet mill to apply to the secondary slurry a shear rate of $1.5 \times 10^6$ to $1.3 \times 10^7$ (1/s).

12 Claims, 11 Drawing Sheets

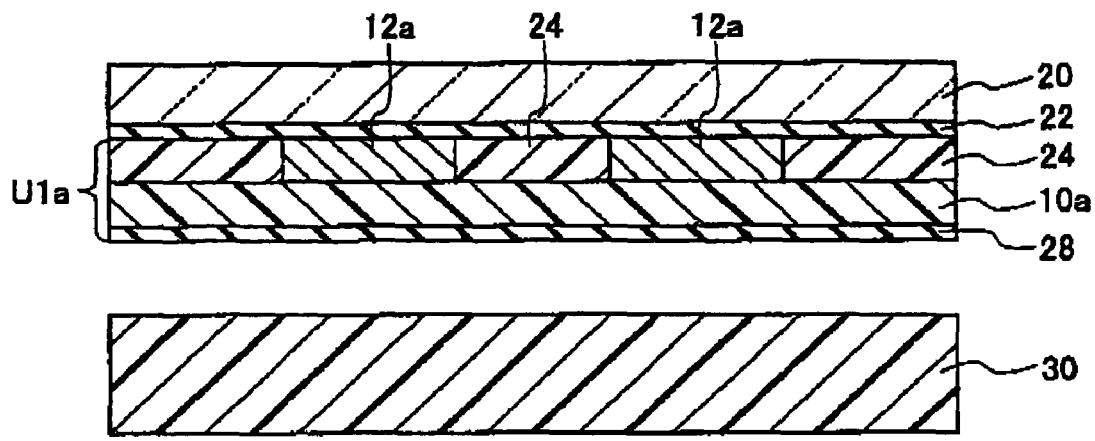
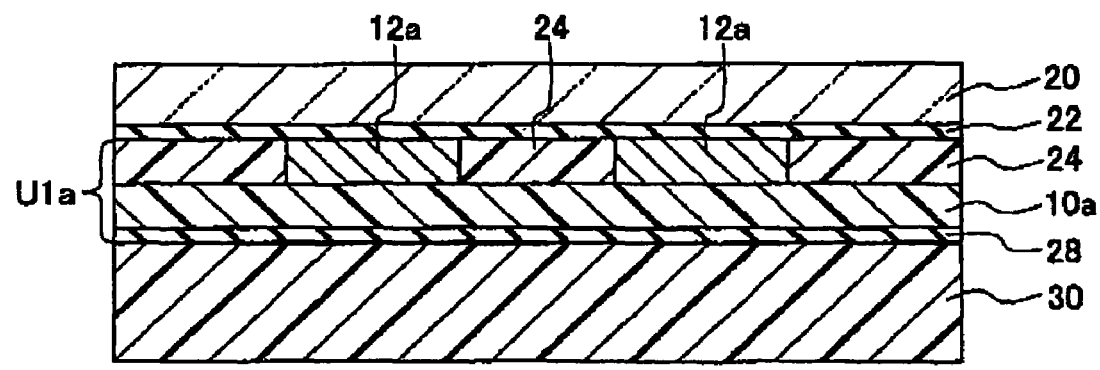
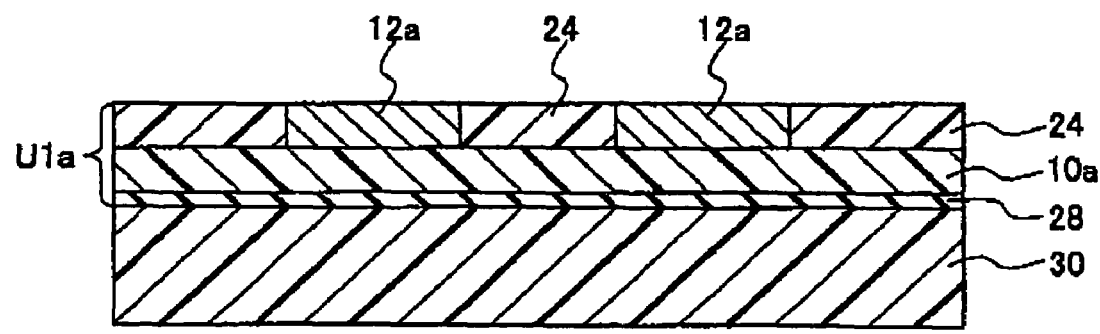

METHOD OF PRODUCTION OF PEELING LAYER PASTE AND METHOD OF PRODUCTION OF MULTILAYER TYPE ELECTRONIC DEVICE

BACKGROUND OF THE INVENTION

1. Field of the Invention

The present invention relates to a method of production of peeling layer paste used for production of a multilayer ceramic capacitor or other multilayer electronic device and a method of production of a multilayer type electronic device using the peeling layer paste.

2. Description of the Related Art

In recent years, due to the increasingly smaller sizes of electronic apparatuses, multilayer ceramic capacitors and other multilayer electronic devices have become increasingly compact in size and sophisticated in performance. The thicknesses of the interlayer dielectric layers of multilayer electronic devices (dielectric layers sandwiched between pairs of internal electrodes) have become 1 μm or less—enabling over 800 stacked layers. In the process of production of such electronic devices, the thicknesses of the green sheets able to form the dielectric layers after firing have become extremely thin (usually 1.5 μm or less), so at the time of formation of the electrode layers by the printing method, the solvent of the electrode layer paste causes the green sheets to dissolve, that is, the so-called "sheet attack" phenomenon becomes a problem. This sheet attack phenomenon leads directly to defects of the green sheets and short-circuit defects, so is a problem which absolutely must be solved for making the layers thinner.

To eliminate this sheet attack, Japanese Patent Publication (A) No. 63-51616, Japanese Patent Publication (A) No. 3-250612, and Japanese Patent Publication (A) No. 7-312326 propose forming an electrode layer paste on a support film in a predetermined pattern, then drying it so as to separately prepare a dry electrode layer, then transferring this dry electrode layer to the surface of a green sheet or the surface of a laminate of green sheets so as to transfer the predetermined pattern of the electrode layer.

However, the technology of Japanese Patent Publication (A) No. 63-51616, Japanese Patent Publication (A) No. 3-250612, and Japanese Patent Publication (A) No. 7-312326 had the problem of a difficulty of peeling off the predetermined pattern of the electrode layer from the support film. Therefore, the inventors proposed technology for forming a peeling layer between a support film and a predetermined pattern of an electrode layer so as to improve the peelability of the electrode layer (see Japanese Patent Publication (A) No. 2003-197457).

However, generally, this type of peeling layer has to be formed extremely thin. Specifically, it is preferably formed to a thickness of 0.2 μm or less. This type of peeling layer is not provided for the purpose of functioning as a dielectric layer after firing and is only provided for the purpose of facilitating formation and peeling of the predetermined pattern of the electrode layer. When forming the peeling layer thick, the active thickness of the interlayer dielectric layer after firing ends up being reduced, so this is disadvantageous for raising the capacity. To make the peeling layer extremely thin, it is necessary to cause ceramic powder having a particle size smaller than the thickness of the peeling layer to homogeneously disperse in the paste for formation of the peeling layer.

However, when using extremely fine ceramic powder to prepare a peeling layer paste by the conventional method, during preparation of the paste, the ceramic powder sometimes partially coagulates. If using peeling layer paste containing partially coagulated ceramic powder to form a peeling layer, the thickness of the peeling layer tends to become thick in parts and therefore a uniform peeling layer becomes hard to form. Even if forming this peeling layer with a predetermined pattern of an electrode layer, the density and surface conditions of the electrode coating deteriorate, so it is difficult to make full use of the merits of a dry electrode.

The peeling layer is formed by coating or drying a peeling layer paste using a bar coater, microgravure coater, extrusion coater, or other device, but to reduce the coated thickness of the peeling layer paste so that the thickness of the final peeling layer becomes 0.2 μm or less, the amount of paste supplied to the coating device has to be made smaller and the nonvolatile concentration of the paste has to be made lower. Further, as the nonvolatile ingredients of the peeling layer paste, the ingredients other than the dispersion medium (solvent) may be considered. Specifically, it is necessary to use a paste with a nonvolatile concentration of 15 wt % or less, but a paste (or slurry) with such an extremely low nonvolatile concentration is hard to stably produce by a single dispersion process. Therefore, it is necessary to repeatedly perform the process of dispersion and dilution of slurry to gradually lower the nonvolatile concentration.

However, at the stage of diluting the slurry, the coagulation phenomenon called "solvent shock" sometimes occurs. There was a problem in high pressure dispersion of a slurry with an extremely low nonvolatile concentration.

Further, Japanese Patent No. 3387455 proposes a method of high pressure dispersion of a green sheet paste used for forming a green sheet for forming a dielectric layer after firing. Specifically, it proposes combining the medium-type dispersion method using pebbles, beads, or another dispersion medium and the high pressure dispersion method of dispersion at a pressure of 100 kg/cm$^2$ or more to cause the ceramic powder to disperse in the paste. Japanese Patent No. 3387455 deals with paste for forming a green sheet of several μm at the thinnest, so the content of the binder contained in the paste is set small. This is because if the amount of binder in the green sheet paste becomes large, the content of the ceramic powder becomes smaller relative to this and cracks and other problems occur at the time of molding or removal of the binder.

As opposed to this, if the amount of binder ends up becoming smaller in a peeling layer paste not for a green sheet, but for forming a peeling layer, the printability to a PET film etc. falls and during printing or after drying, the peeling layer easily sheds ceramic powder and the effect of forming the peeling layer tends strongly to be impaired. Therefore, it was difficult to apply the technology of Japanese Patent No. 3367455 to a peeling layer paste for forming a peeling layer. On the other hand, if increasing the amount of binder to raise the concentration in the dispersion process, the dispersion overly rises in viscosity, so good dispersion is difficult. Therefore, it is necessary to provide a later dilution process, cause good dispersion in the state with a small amount of binder, and in the later dilution process add a binder to adjust the amount of the binder.

SUMMARY OF THE INVENTION

An object of the present invention is to provide a method of production of peeling layer paste used for producing a multilayer electronic device which is able to form a peeling layer not susceptible to sheet attack for an electrode layer paste for forming the electrode layer (in accordance with need, a blank pattern layer paste for forming a blank pattern), free from partial coagulation of the ceramic powder, and low in nonvolatile concentration and a method of production of a multilayer type electronic device using the peeling layer paste produced by this method.

To achieve the above object, according to the present invention, there is provided a method of production of a peeling layer paste used for producing a multilayer electronic device, the method of production of a peeling layer paste having:
a step of preparing a primary slurry containing a ceramic powder having an average particle size of 0.1 µm or less, a binder, and a dispersion agent and having a nonvolatile concentration of 30 wt % or more,
a step of adding to the primary slurry a binder-lacquer solution to dilute the primary slurry to prepare a secondary slurry having a nonvolatile concentration of 15 wt % or less and a content of the binder of 12 parts by weight or more with respect to 100 parts by weight of the ceramic powder, and
a high pressure dispersion treatment step of running the secondary slurry through a wet jet mill to apply to the secondary slurry a shear rate of $1.5 \times 10^6$ to $1.3 \times 10^7$ (1/s).

Preferably, the method performs the high pressure dispersion treatment by making the secondary slurry collide at 80 to 200 MPa pressure and 400 to 630 m/s flow rate.

According to the present invention, there is provided a method of production of a peeling layer paste used for producing a multilayer electronic device, the method of production of a peeling layer paste having:
a step of preparing a primary slurry containing a ceramic powder having an average particle size of 0.1 µm or less, a binder, and a dispersion agent and having a nonvolatile concentration of 30 wt % or more,
a first high pressure dispersion treatment step of running the primary slurry through a wet jet mill to apply to the primary slurry a shear rate of $1.5 \times 10^6$ to $1.3 \times 10^7$ (1/s),
a step of adding to the slurry after the first high pressure dispersion treatment a binder-lacquer solution to dilute the slurry after the first high pressure dispersion treatment and prepare a secondary slurry having a nonvolatile concentration of 15 wt % or less and a content of the binder of 12 parts by weight or more with respect to 100 parts by weight of the ceramic powder, and
a second high pressure dispersion treatment step of running the secondary slurry through a wet jet mill again to apply to the secondary slurry a shear rate of $1.5 \times 10^6$ to $1.3 \times 10^7$ (1/s).

Preferably, the method performs the first and second high pressure dispersion treatments by causing collision of the primary slurry and secondary slurry at 80 to 200 MPa pressure and 400 to 630 m/s flow rate. Preferably, it makes the content of the binder in the primary slurry 7 parts by weight with respect to 100 parts by weight of the ceramic powder.

According to the present invention, there is provided a method of production of a multilayer type electronic device having:
a step of forming on a surface of a first support sheet a peeling layer of 0.2 µm, a step of forming an electrode layer on the surface of the peeling layer in a predetermined pattern,
a step of forming a green sheet on the surface of the electrode layer to obtain a green sheet having an electrode layer,
a step of stacking green sheets having the electrode layers to form a green chip, and
a step of firing the green chip, wherein the peeling layer paste used for forming the peeling layer is a peeling layer paste produced by any of the above methods.

The multilayer electronic device is not particularly limited. A multilayer ceramic capacitor, multilayer ceramic inductor, multilayer ceramic LC device, multilayer ceramic board, etc. may be mentioned.

According to the peeling layer paste produced by the method of the present invention, it is possible to form a peeling layer not susceptible to sheet attack for an electrode layer paste for forming an electrode layer or a blank pattern layer paste for forming a blank pattern layer.

The peeling layer paste produced by the method of the present invention is free from partial coagulation of the ceramic powder and superior in dispersability. Therefore, not only is it possible to make the thickness of the peeling layer formed uniform, but it is also possible to make the surface of the peeling layer much smoother.

The peeling layer paste produced by the method of the present invention has a low nonvolatile concentration constituted by ingredients other than the dispersion medium. Therefore, it is possible to form an extremely thin peeling layer of 0.2 µm or less.

The peeling layer formed using the peeling layer paste produced by the method of the present invention is smoothed on its surface. Therefore, it is possible to reduce the surface roughness of the electrode coating at the time of stacking, suppress the occurrence of defects (structural defects) at the time of stacking, and reduce the short-circuit defects of the finally obtained multilayer electronic device.

BRIEF DESCRIPTION OF THE DRAWINGS

Below, the present invention will be explained based on the embodiments shown in the drawings, in which;

FIG. 7A to FIG. 7C and FIG. 8A to FIG. 8C are cross-sectional views of principal parts showing a method of stacking green sheets having electrode layers according to another embodiment of the present invention, FIG. 9A is an SEM photograph showing the surface conditions of the peeling layer of Example 1, while

DESCRIPTION OF THE PREFERRED EMBODIMENTS

In the present embodiment, as the multilayer electronic device, a multilayer ceramic capacitor is explained as an example.

Multilayer Ceramic Capacitor

Figure 1:
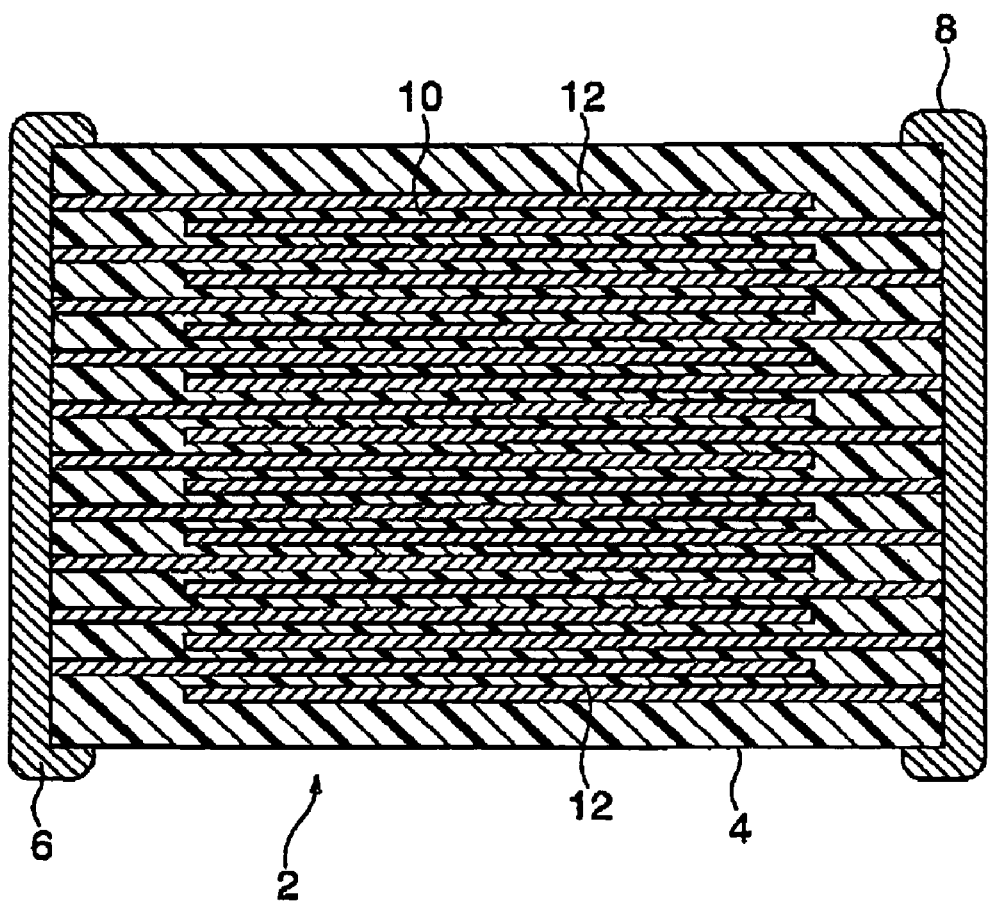
FIG. 1 is a schematic cross-sectional view of a multilayer ceramic capacitor according to an embodiment of the present invention, FIG. 2A to FIG. 2C is cross-sectional views of principal parts showing a method of formation of an electrode layer and green sheet according to an embodiment of the present invention.

As shown in FIG. 1, the multilayer ceramic capacitor 2 according to an embodiment of the present invention has a capacitor body 4 comprised of dielectric layers 10 and internal electrode layers 12 alternately stacked. This capacitor body 4 is formed at its two side ends with a pair of external electrodes 6, 8 connected to the internal electrode layers 12 alternately arranged inside the body 4. The internal electrode layers 12 are stacked so that the side end faces are alternately exposed at the surfaces of the two facing ends of the capacitor body 4. The pair of external electrodes 6, 8 are formed at the two ends of the capacitor body 4 and are connected to the exposed end faces of the alternately arranged internal electrode layers 12 to form a capacitor circuit.

The external shape and dimensions of the capacity body 4 are not particularly limited and can be suitably set in accordance with the application. Usually, the external shape is made a substantially parallelopiped shape and the dimensions are made normally (0.4 to 5.6 mm)×(0.2 to 5.0 mm)×(0.2 to 1.9 mm) or so.

Figure 2A:
Figure 2B:
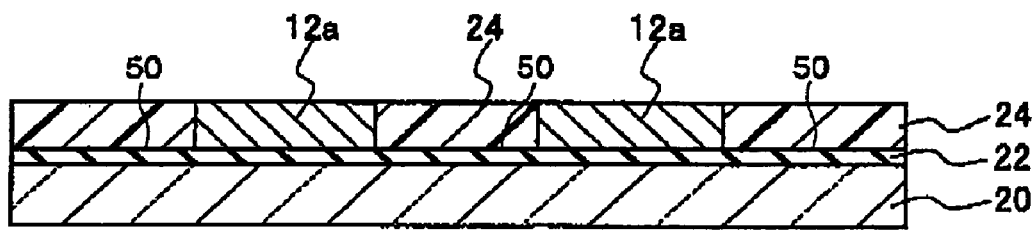
Figure 2C:
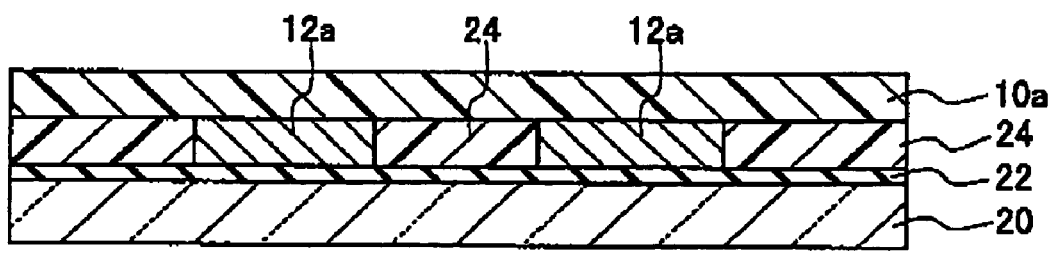

The dielectric layers 10 are formed by firing the green sheets 10a shown in FIG. 2C etc. They are not particularly limited in material. For example, they may be formed by calcium titanate, strontium titanate, and/or barium titanate or another dielectric material. The thickness of each of the dielectric layers 2 is, in the present embodiment, preferably reduced to 5 μm or less, more preferably 3 μm or less.

The internal electrode layers 12 are formed by firing predetermined patterns of electrode layers 12a formed by the electrode layer paste shown in FIG. 2B or FIG. 2C. The thickness of each of the internal electrode layers 12 is preferably reduced to 1.5 μm or less, more preferably 1.0 μm or less.

The material of external electrodes 6, 8 used is usually copper or a copper alloy, nickel or a nickel alloy, etc., but silver or a silver and palladium alloy etc. can also be used. The thickness of the external electrodes 6, 8 is not particularly limited, but usually is 10 to 50 μm or so.

Method of Production of Multilayer Ceramic Capacitor

Next, an example of the method of production of a multilayer ceramic capacitor 2 according to the present embodiment will be explained.

Formation of Peeling Layer (1) In the present embodiment, first, as shown in FIG. 2A, a carrier sheet 20 is formed with a peeling layer 22 to a thickness of 0.2 μm or less, preferably 0.1 μm or less (after drying). As the carrier sheet 20, for example, a PET film etc. is used The surface of the carrier sheet 20 for forming the peeling layer 22 is preferably improved in peelability by coating it with a release agent mainly comprised of silicone, an alkyd resin, etc. The thickness of the carrier sheet 20 is not particularly limited, but preferably is 5 to 100 μm.

If the thickness of the peeling layer 22 formed on the carrier sheet 20 is more than 0.2 μm, the later mentioned electrode layer 12a (see FIG. 2B) becomes difficult to peel off from the carrier sheet 20 and, at the time of peeling, the electrode layer 12a is liable to break. On the other hand, if the thickness of the peeling layer 22 is too small, there is no longer an effect of formation of the same. Therefore, in the present embodiment, the lower limit is preferably made 0.01 μm, more preferably 0.05 μm.

The method of formation of the peeling layer 22 is not particularly limited so long as it is a method able to form the layer uniformly in the above thickness, but in the present embodiment, the case of use of the method of coating the peeling layer paste (for example by a wire-bar coater or die coater) is illustrated.

Peeling Layer Paste

The peeling layer paste used in the present embodiments is mainly comprised of a ceramic powder and an organic vehicle and further contains a plasticizer and release agent.

As the ceramic powder, one of the same composition as the ceramic powder contained in the later explained green sheet 10a is used.

The average particle size of the ceramic powder is preferably smaller than the thickness of the peeling layer 22. Specifically, powder of a size of 0.2 μm or less, preferably 0.1 μm or less, is used. If the average particle size exceeds 0.2 μm, the thickness of the peeling layer 22 cannot be made 0.2 μm or less. On the other hand, if the average particle size of the ceramic powder is too small, poor dispersion or other problems will occur. Therefore, in the present embodiment, the lower limit is preferably made 0.01 μm.

The ceramic powder is contained in the peeling layer paste in a range so that the nonvolatile concentration becomes, as explained later, 15 wt % or less, preferably 10 wt % or less.

The organic vehicle contains a binder and a dispersion medium.

As the binder, for example, a polyvinyl acetal-based resin, acryl-based resin, cellulose-based resin, vinyl acetate resin, etc. may be used. As a polyvinyl acetal-based resin, polyvinyl acetoacetal, polyvinyl acetal (acetal group R=$CH_3$), polyvinyl butyral (acetal group R=$C_3H_7$), polyvinyl formal (acetal group R=H), polyvinyl benzal, polyvinyl phenylacetal, polyvinyl-propional, polyvinyl hexanal, polyvinyl benzal, etc. may be illustrated.

In the present embodiment, the case of mainly comprising a specific acryl resin or polyvinyl acetal is illustrated.

First, in a first aspect of the present embodiment, a binder mainly comprised of a specific acryl resin is used. The content of the acryl resin in the binder is preferably 95 wt % or more, more preferably 100 wt %. As a resin able to be used together with an acryl resin, though in very small amounts, there is ethyl cellulose, a polyvinyl acetal-based resin, etc. As a polyvinyl acetal-based resin, the ones explained above may be mentioned.

The acryl resin used in the first aspect is comprised of a copolymer mainly comprised of acrylic acid ester monomer units and methacrylic acid ester monomer units (hereinafter also abbreviated as "(meth) acrylic acid ester monomer units"). The ratio of copolymerization of the acrylic acid ester monomer units and the methacrylic acid ester monomer units is, for example, when using as the former, butyl acrylate monomer units and using as the latter, methyl methacrylate monomer units, by wt %, for example 10 to 30:90 to 70 or so.

As the (meth)acrylic acid ester monomer, methyl (meth) acrylate, ethyl (meth)acrylate, propyl (meth)acrylate, n-butyl (meth)acrylate, isobutyl (meth)acrylate, t-butyl (meth)acrylate, 2-ethylhexyl (meth)acrylate, octyl (meth)acrylate, etc. may be mentioned, but in the present embodiment, it is preferable to combine monomers so that in the final resin state, the glass transition temperature (Tg) becomes room temperature or more.

The total content of the (meth)acrylic acid ester monomer units in the acryl resin is preferably 95 wt % or more, more preferably 100 wt %. The third monomer unit able to be used, though in very small amounts, in combination with the (meth) acrylic acid ester monomer units is not particularly limited so long as it is copolymerizable with the (meth)acrylic acid ester monomer units, but for example there are (meth)acrylic acid monomer units, aromatic vinyl monomer units, vinyl ester monomer units, vinyl ether monomer units, etc. As the aromatic vinyl monomer, styrene, vinyl toluene, α-methylstyrene, etc. may be mentioned. As the vinyl ester monomer, vinyl acetate, vinyl propionate, etc. may be mentioned. As the vinyl ether monomer, methylvinyl ether, ethylvinyl ether, hydroxybutylvinyl ether, etc. may be mentioned.

The acryl resin used in the first aspect has an acid value (number of mg of KOH required for neutralizing the free acids in 1 g of the acryl resin) of 1 to 10 mgKOH/g, preferably 5 to 10 mgKOH/g. The acid value of the acryl resin is related to the dispersion with the ceramic powder. If the acid value of the acryl resin is outside the above range, the dispersability of the ceramic powder becomes extremely poor. In practice, if less than 1 mgKOH/g, the ceramic powder will not disperse. On the other hand, if over 10 mgKOH/g, a coagulation effect will occur and the dispersability will become poor and, further, the peeling strength will tend to become too great, so this is not preferred. The acid value of the acryl resin can be adjusted by the amount blended of the (meth) acrylic acid monomer units. For example, if increasing the amount blended of the acrylic acid monomer units or the methacrylic acid monomer units, the acid value will rise, while conversely if decreasing it, the acid value will fall as a general tendency. The acid value of the acryl resin can be measured by a method based on JIS-K0070.

The weight average molecular weight (Mw) of the acryl resin used in the first aspect is not particularly limited, but, converted to polystyrene value using gel permeation chromatography (GPC), is preferably 130,000 to 700,000, more preferably 250,000 to 500,000. If the weight average molecular weight is too small, the strength falls, the tackiness becomes too strong, and the peeling strength becomes too high, while conversely if too great, dispersion becomes difficult and the result is hard and brittle, so the strength becomes too weak.

The acryl resin used in the first aspect preferably is an acryl resin having a high glass transition temperature Tg, more preferably a Tg of room temperature or more. By using an acryl resin with a Tg of room temperature or more, it is possible to further reduce the peeling strength of the peeling layer 22.

Next, in the second aspect of the present embodiment, a binder mainly comprised of polyvinyl acetal (acetal group R=CH$_3$) is used. The content of the polyvinyl acetal in the binder is preferably 95 wt % or more, more preferably 100 wt %. As the resin which can be combined, though in a very small amount, with the polyvinyl acetal, there are polyvinyl acetal-based resins other than polyvinyl acetal, acryl resins, ethyl cellulose, etc.

The polyvinyl acetal used in a second aspect has a polymerization degree of preferably 2000 to 3600, more preferably 2000 to 2400. If the polymerization degree is less than 2000, sheet attack is liable to occur, while if over 3600, the peeling layer paste will become too high in viscosity, so the dispersability in ceramic powder will be poor and a homogeneous paste will become difficult to obtain.

The polyvinyl acetal used in the second aspect has a residual amount of acetyl groups of usually 3 mol % or less. If the residual amount of acetyl groups exceeds 3 mol %, production becomes extremely difficult.

The polyvinyl acetal used in the second aspect has an acetalization degree (content of acetal groups) of preferably 66 to 74 mol %. If the acetalization degree exceeds 74 mol %, production becomes extremely difficult.

Further, the acetalization degree of the polyvinyl acetal can be calculated by measuring the residual amount of acetal groups and amount of vinyl alcohol based on JIS-K6729 "Polyvinyl Formal Test Method" and subtracting the amounts of the above two ingredients from 100.

The above-mentioned binder is contained in the peeling layer paste in an amount, with respect to 100 parts by weight of the ceramic powder, of 12 parts by weight or more, preferably 24 parts to 50 parts by weight.

The dispersion medium (solvent) is not particularly limited. Hydrocarbons (mineral spirits and other aliphatic types; toluene, xylene, and other aromatic types), esters (ethyl acetate etc.), ketones (acetone, MEK, etc.), alcohols, etc. may all be used. In the present embodiment, preferably mixed solutions of alcohols, ketones, and aromatic hydrocarbons can be used.

The solvent is contained in a range whereby the nonvolatile concentration in the peeling layer paste becomes, as explained later, 15 wt % or less, preferably 10 wt % or less.

The plasticizer is not particularly limited; phthalic acid esters, adipic acid, phosphoric acid esters, glycols, etc. may be illustrated. In the present embodiment, preferably, dioctyl adipate (DOA), butylbutyleneglycol phthalate (BPBG), didodecyl phthalate (DDP), dibutyl phthalate (DBP), dioctyl phthalate (DOP), butylbenzyl phthalate (BBP), dibutyl sebacate, etc. is used. Among these, use of one or more plasticizers selected from DBP, DOP, and BBP is particularly preferable.

The plasticizer is contained in an amount, with respect to 100 parts by weight of the ceramic powder, of preferably 5 to 100 parts by weight (however, excluding 5 parts by weight and 100 parts by weight), more preferably 20 to 70 parts by weight. The plasticizer controls the Tg of the binder in the organic vehicle. By its addition, the peeling strength of the peeling layer becomes greater, but the stackability (bondability at time of stacking) is improved. Basically, there is no problem even with zero addition of the plasticizer, but when adding this for improving the stackability, transfer, etc., the upper limit is, with respect to 100 parts by weight of the ceramic powder, preferably 100 parts by weight. This is because the addition of the plasticizer causes the peeling layer to increase in tackiness resulting in sticking to the screen or adhesion to the running system, so continuous printing becomes difficult.

The dispersion agent is not particularly limited, but a polyethylene glycol-based dispersion agent, polycarboxylate-based dispersion agent, polyhydric alcohol partial ester-based dispersion agent, ester-based dispersion agent, ether-based dispersion agent, etc. may be illustrated. In addition, there are a block polymer type dispersion agent or a graft and polymer type dispersion agent. In the present embodiment, preferably a polyethylene glycol-based dispersion agent or polycarboxylate-based dispersion agent is used.

The dispersion agent is contained in an amount, with respect to 100 parts by weight of the ceramic powder, of preferably 1 to 3.5 parts by weight, more preferably 1.5 to 2.5 parts by weight. The dispersion agent has the effects of improvement of the dispersability of the pigment (ceramic powder) and improvement of the stability of the coating (ageing) If the content of the dispersion agent is too small, the effect of adding this becomes insufficient, while if too great, the problem of a drop in the dispersability due to formation of micelles or recoagulation sometimes arises.

The release agent is not particularly limited, but paraffin, a wax, fatty acid esters, silicone oil, etc. may be illustrated. The peeling agent used here may be the same as or different from the peeling agent contained in the green sheet 10a.

The release agent is contained in an amount, with respect to 100 parts by weight of the binder in the organic vehicle, of preferably 0 to 15 parts by weight (however, excluding 0 part by weight), more preferably 5 to 10 parts by weight.

Further, the peeling layer paste may further contain an anti-static aid or other additive.

The peeling layer paste used in the present embodiment is prepared so that the nonvolatile concentration comprised of everything except the dispersion medium in the vehicle is 15 wt % or less, preferably 10 wt % or less.

Method of Production of Peeling Layer Paste

It is difficult to cause sufficient dispersion (high pressure dispersion) of extremely fine ceramic powder having an average particle size of 0.1 µm or less by a single operation. Further, it is difficult to obtain a peeling layer paste with a low nonvolatile concentration. Therefore, in the present embodiment, first a primary slurry with a relatively high nonvolatile concentration is prepared, then this is diluted to obtain a secondary slurry and this secondary slurry is subjected to high pressure dispersion treatment.

Further, in the following explanation, the case is illustrated of the peeling layer used in the present embodiment containing a ceramic powder, organic vehicle (binder and dispersion medium), plasticizer, release agent, and dispersion agent.

(1-1) First, a primary slurry having a nonvolatile concentration of 30 wt % or more, preferably 40 wt % or more, is prepared. In the present embodiment, the binder content is adjusted to an amount, with respect to 100 parts by weight of the ceramic powder, of preferably 7 parts by weight or less and more preferably 6 parts by weight to 4.5 parts by weight. If the amount of the binder here is too large, the primary slurry will rise in viscosity, so efficient dispersion will become difficult. Therefore, in the present embodiment, a small amount of binder is used for dispersion with the ceramic powder, then later a binder-lacquer solution is added to adjust the amount of binder.

The primary slurry can be prepared by weighing out predetermined amounts of the ceramic powder, organic vehicle (binder and dispersion medium), plasticizer, release agent, and dispersion agent and mixing and pulverizing these by a ball mill, sand mill, or other medium-type dispersion method.

(1-2) Next, the primary slurry is diluted to give a nonvolatile concentration of 15 wt % or less, preferably 10 wt % or less, so as to prepare a secondary slurry having a content of the binder of an amount, with respect to 100 parts by weight of the ceramic powder, of 12 parts by weight or more, preferably 24 parts by weight or more. If the nonvolatile concentration is over 15 wt % even if diluting the primary slurry, it will be difficult to form the final peeling layer 22 to a thin layer of a dried thickness of 0.2 µm or less. On the other hand, if the nonvolatile concentration is too small, the finally obtained peeling layer paste will become smaller in paste viscosity and drop in coating ability and formation of uniform layer thickness without crawling will also become difficult. Therefore, its lower limit is preferably 5 wt %, more preferably 7 wt %.

Further if the binder content is a too small less than 12 parts by weight with respect to 100 parts by weight of the ceramic powder, the finally obtained peeling layer paste will fall in strength, the dried peeling layer will shed ceramic powder, and the provision of the peeling layer will end up losing all meaning. On the other hand, if the binder content is too great, when removing the binder or when firing, cracks will easily occur and the tackiness will increase therefore possibly making printing difficult. Therefore, the upper limit is preferably 50 parts by weight.

The primary slurry can be diluted by mixing the above obtained primary slurry with for example a binder-lacquer solution prepared to a predetermined composition by a ball mill, sand mill, or other medium type dispersion method.

However, it is also possible to perform the later explained high pressure dispersion treatment before dilution, then dilute the slurry so as to prepare a secondary slurry of the above nonvolatile concentration and binder content.

(1-3) Next, the secondary slurry is subjected to a high pressure dispersion treatment to obtain a superfine particle-state dispersion constituted by the peeling layer paste. Specifically, the secondary slurry is run through a wet jet mill to apply to the secondary slurry a shear rate of $1.5 \times 10^6$ to $1.3 \times 10^7$ (1/s) (high pressure dispersion treatment).

By applying to the secondary slurry a shear rate of this range, coagulation of the ceramic powder in the secondary slurry is effectively broken up and the ceramic powder can be made to disperse to an advanced state in primary particle units. With this method, since the shear force is applied over the entire secondary slurry, floating dust (undispersed particles) as seen in the above-mentioned medium-type dispersion method becomes hard to occur. By using a paste dispersed to the primary particle unit so as to form the peeling layer, the thickness becomes uniform and an extremely thin peeling layer can be formed. Further, it is possible to make the electrode coating small in surface roughness and reduce the short-circuit defect rate of the capacitors.

In the present embodiment, to prevent the entry of foreign matter into the dispersion and pulverize and finely disperse the ceramic powder efficiently in a short time, it is preferable to perform the high pressure dispersion treatment by the method of causing collision of the second slurry at a pressure of 80 to 200 MPa, preferably 80 to 170 MPa and a flow rate of 400 to 630 m/s, preferably 400 to 580 m/s. If performing high pressure dispersion treatment under these conditions, it is possible to apply to the secondary slurry a shear rate of $1.5 \times 10^6$ to $1.3 \times 10^7$ (1/s) and as a result possible to finely reduce the size of the ceramic powder in the secondary slurry to an average particle size or 0.05 to 1.0 µm in range and stably cause fine dispersion in the dispersion through a dispersion agent.

By using a wet jet mill to convey the secondary slurry under high pressure from facing channels to nozzles arranged in a pressure resistant vessel in the sealed state and making the facing flows of the secondary slurry collide and merge, the ceramic powder in the the secondary slurry is pulverized to ultrafine particles and made to finely disperse together with the dispersion agent in the slurry with a high dispersion and low concentration.

Further, as the apparatus for finely reducing the size of powder, in the past the dry type and wet type jet mills have been known. A "dry jet mill" causes collision of the particles of the treated substance or the particles and the channel walls in air or $N_2$ so as to make the particles finer in size, while a "wet jet mill" causes collision of the particles of the treated substance or the particles and the channel walls in a liquid phase flow so as to make the particles finer in size. In the case of a wet jet mill, in addition to the reduction in size due to the collisions, there is the complex treatment action of the cavitation, turbulence, shear, etc. occurring in the liquid phase, so the reduction in size of the ceramic powder is remarkably promoted.

The "wet jet mill" used in the present embodiment is a general term for apparatuses which use any method to cause a high pressure, high speed flow to make secondary slurry collide with itself and which effectively utilize the turbulence, shear, and cavitation effect etc. caused by the high pressure, high speed flow so as to finely reduce the size of the ceramic power in the secondary slurry and promote the pulverization and dispersion.

As such a wet jet mill, there is a high pressure homogenizer. Specifically, there are a type using a plunger pump, a rotary pump, etc. to eject the treated solution (in the present embodiment, the secondary slurry) from the nozzles to make it collide with a fixed plate at a high speed and a type making ejected treated solution collide head on. When the treated solution passes through the channels at a high speed or passes through them while colliding with the channel walls, it receives turbulence and shear. The dispersoid contained in the treated solution (ceramic powder) is therefore broken up. When reduced in pressure right after collision, a cavitation effect occurs. Due to the shock of the rapid release of pressure, crushing occurs inside the dispersoid. The dispersoid is therefore uniformly dispersed in the treatment system while being pulverized to ultrafine particles.

As the wet jet mill able to be used in the present embodiment, types marketed as "high pressure homogenizers" such as types utilizing high speed injection using valve plates (made by APV Gaurin, Lanier, Soavi, Nippon Seiki, etc.), types causing high speed collision inside slit-shaped channels ("Micro-Fluidizer", made by Microfluidex), types causing high speed collisions in individual channels communicated offset 90° in phase ("Nanomizer", made by Nanomizer), types causing a plurality of collisions of fluid in the same nozzle ("Nanomaker", made by SG Engineering), types causing fluid collision in a flattened channel device ("Aqua", made by Aquatec), or types causing ejection from facing orifices into an aspherical structure chamber to cause collision ("Ultimizer", made by Sugino Machine) superhigh speed high pressure wet jet mills marketed by Genus under the product name "Genus PY", etc. may be mentioned.

These wet jet mills differ somewhat in the effect of pulverization and dispersion of the ceramic powder due to the characteristics of the types of equipment, but compared with use of conventional medium-type dispersion mixers and other such dispersion apparatuses, it is possible to finely pulverize and finely disperse the powder with striking high efficiency and possible to obtain an extremely stable, superfine particle-state dispersion constituted by the peeling layer paste.

To make the average particle size of the ceramic powder finely dispersed in the peeling layer paste after the high pressure dispersion treatment 0.1 μm or less, it is necessary to make the flow rate in the superhigh pressure, high speed treatment unit of the wet jet mill 400 m/s or more, preferably 450 m/s or more, and secure a pressure of 80 MPa or more, preferably 100 MPa or more. If the flow rate is less than 400 m/s and the pressure is less than 80 MPa, the ceramic powder in the peeling layer paste is difficult to pulverize to an average particle size of 0.1 μm or less, so the effects of the present invention cannot be achieved.

The effect of pulverization and dispersion by the wet jet mill is better the higher the pressure and flow rate at the time of the operation. In some cases, it is possible to reduce the ceramic powder to an average particle size of a superfine 0.01 μm or less. However, if excessively raising the pressure or flow rate, not only do the requirements for pressure resistance, wear resistance, etc. of the facilities become extremely severe and the capital costs become tremendous, but also the lifetime of the nozzle unit becomes extremely short. Further, even if reducing the ceramic powder to an average particle size of a superfine 0.01 μm or less, since in practice, the performance cannot be raised beyond that, if considering practicality, the upper limit of the pressure at the time of treatment by the wet jet mill is 200 MPa, preferably 170 MPa, and the upper limit of the flow rate is 630 m/s, preferably 580 m/s.

In the present invention, so long as the above flow rate and pressure can be secured, the specific structure of the wet jet mill etc. is not particularly limited. However, the mills preferable for achieving the object of the present invention are ones of the type making the ejected treated slurry collide head on, for example, the superhigh speed high pressure wet jet mills marketed by Sugino Machine under the product name "Ultimizer". If using these apparatuses, it is possible to easily achieve the above-mentioned superhigh speed, high pressure treatment conditions. Depending on the treatment conditions, a single pass, or if necessary two passes or more of repeated treatment, enables a dispersion comprised of ceramic powder uniformly and stably dispersed in a superfine particle state to be easily obtained. If using such a wet jet mill, compared with when using conventional medium type dispersion mixers and other dispersion apparatuses for dispersion treatment, the effect of the pulverization and dispersion is remarkably enhanced and it is possible to obtain an extremely stable superfine particle dispersion constituted by the peeling layer paste by short treatment.

Figure 11:
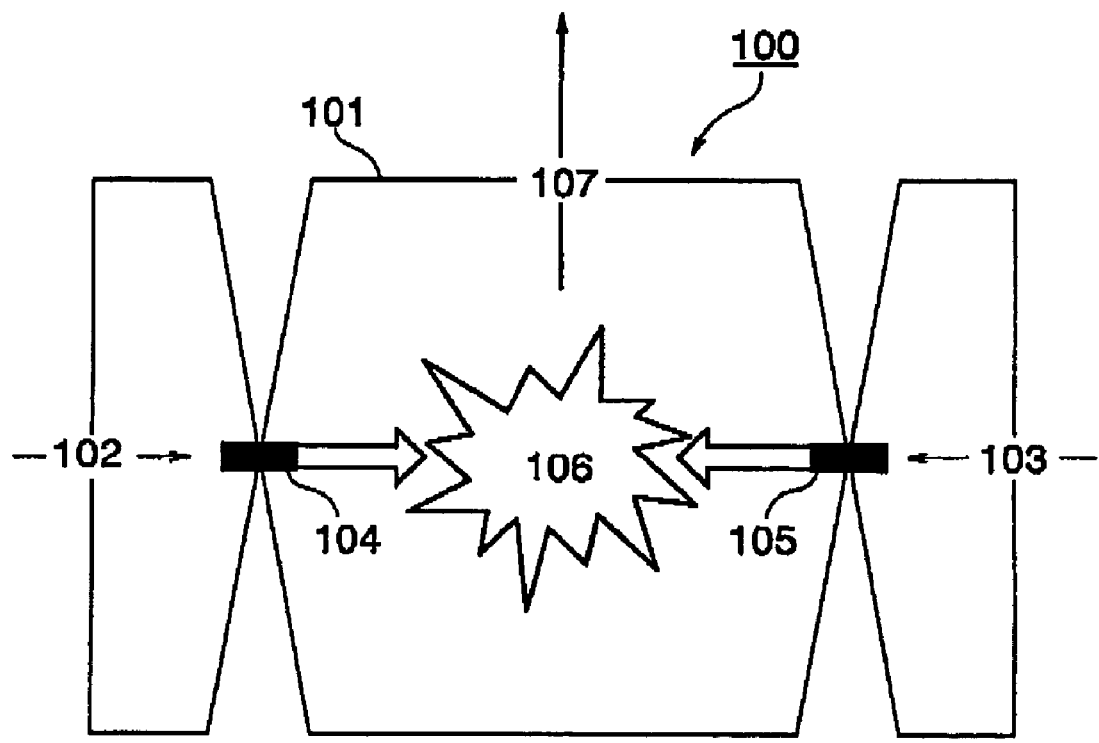
FIG. 11 is a conceptual view showing an example of a wet jet mill preferably used for high pressure dispersion treatment in the present embodiment.

Below, the structure of the "Ultimizer" will be briefly explained. As shown in FIG. 11, the wet jet mill 100 preferably used in the present embodiment has a pressure vessel 101, slurry flow channels 102, 103 branching apart in the vessel, nozzles 104, 105 arranged facing each other across a center header 106, and an outflow channel 107 for taking out the finely reduced slurry material from the header 106. Therefore, by branching the high pressure slurry to two channels in the pressure resistant vessel and sending the slurry under pressure in the sealed state toward the nozzles 104, 105 arranged facing each other, the accelerated slurry collides inside the header 106 to be pulverized to form and disperse superfine particles.

The superfine particle dispersion obtained by subjecting the secondary slurry to high pressure dispersion treatment, constituted by the peeling layer paste, as explained above is comprised of extremely fine ceramic powder having an average particle size of 0.010 to 0.2 μm uniformly dispersed in a dispersion and has high pressure dispersability and dispersion stability. As a result, an extremely thin peeling layer can be uniformly formed.

The thus obtained peeling layer paste is coated on a carrier sheet 20, then dried to form a peeling layer 22. The drying temperature is not particularly limited, but is preferably 50 to 100° C. The drying time is preferably 1 to 10 minutes.

Formation of Electrode Layer

Next, as shown in FIG. 2B, the surface of the peeling layer 22 formed on the carrier sheet 20 is formed with a predetermined pattern of an electrode layer (internal electrode pattern) 12A giving the internal electrode layer 12 shown in FIG. 1 after firing.

The thickness of the electrode layer 12a is preferably 0.1 to 2.0 μm, more preferably 0.1 to 1.0 μm or so. The thickness of the electrode layer 12a is, with the current art, within that range or so, but the thinner the better in the range where electrode breakage does not occur. The electrode layer 12a may be formed by a single layer or be formed by a plurality of layers with two or more different compositions. Further, in the present embodiment, since the peeling layer 22 is formed with the electrode layer 12a, crawling of the electrode can be effectively prevented and the electrode layer 12a can be formed well with a high precision.

The method of formation of the electrode layer 12a is not particularly limited so long as it is a method that can form the layer uniformly. For example, screen printing or gravure printing or another thick film forming method using the electrode layer paste or vapor deposition, sputtering, or another thin film method may be mentioned, but in the present embodiment, the case of using the electrode layer paste for the thick film method of screen printing or gravure printing is illustrated.

The electrode layer paste used in the present embodiment contains a conductive powder and an organic vehicle. The conductive powder is not particularly limited, but preferably is comprised of at least one material selected from Cu, Ni, and their alloys, more preferably is comprised of Ni or an Ni alloy or mixtures of the same. As the Ni alloy, an alloy of at least one element selected from Mn, Cr, Co, and Al with Ni is preferable. The Ni content in the alloy is preferably at least 95 wt %. Further, the Ni or Ni alloy may contain P, Fe, Mg, or other various trace ingredients up to 0.1 wt % or so or less. This conductive powder is not particularly limited in shape and may be spherical, flake shaped, etc. and may be a mixture of these shapes. Further, the particle size of the conductive powder is, in the case of spheres, usually 0.1 to 2 μm, preferably 0.2 to 1 μm or so.

The conductive powder is contained in the electrode layer paste in an amount of preferably 40 to 70 wt %, more preferably 45 to 60 wt %.

The organic vehicle contains a binder and a solvent. The binder is not particularly limited, but ethyl cellulose, acryl resin, polyvinyl butyral, polyvinyl acetal, polyvinyl alcohol, polyolefin, polyurethane, polystyrene, or copolymers of the same etc. may be illustrated. In the present embodiment, in particular, polyvinyl butyral is used. The binder is contained in the electrode layer paste in an amount, with respect to 100 parts by weight of the conductive powder, of preferably 8 to 20 parts by weight. The solvent is not particularly limited, but terpineol, butyl carbitol, kerosine, acetone, isobornyl acetate, etc. may be illustrated. In the present embodiment, in particular, terpineol, dehydroterpineol, terpineol acetate, or dehydroterpineol acetate is used. The solvent is contained in the electrode layer paste in an amount of preferably 20 to 55 wt %, more referably 20 to 45 wt %.

The electrode layer paste, in the same way as the above peeling layer paste, may contain as a sintering inhibition a ceramic powder of the same composition as the ceramic powder contained in the later explained green sheet 10a. The sintering inhibition has the action of suppressing sintering of the conductive powder in the firing process. The ceramic powder used as the sintering inhibition is contained in the electrode layer paste in an amount, with respect to 100 parts by weight of the conductive powder, of preferably 5 to 25 parts by weight.

The electrode layer paste preferably contains, for the purpose of improving the bondability with the green sheet, a plasticizer or tackifier. As the plasticizer, a phthalic acid ester, adipic acid, phosphoric acid ester, glycols, etc. may be illustrated. The plasticizer is contained in an amount, with respect to 100 parts by weight of the binder in the organic vehicle, of preferably 10 to 300 parts by weight. If the content of the plasticizer is too small, there is no effect of addition, while if too great, the electrode layer 12a formed seriously falls in strength and, further, excess plasticizer tends to seep out from the electrode layer 12a.

The electrode layer paste can be formed by kneading the above ingredients by a ball mill etc. to form a slurry.

Formation of Blank Pattern Layer (3) In the present embodiment, after or before the surface of the peeling layer 22 is formed with a predetermined pattern of an electrode layer 12a by the printing method, the clearances on the surface of the peeling layer 22 where the electrode layer 12a is not formed shown in FIG. 2B (blank pattern parts 50) are formed with a blank pattern layer 24 of the same thickness as the electrode layer 12a. The thickness of the blank pattern layer 24 is made the same as the thickness of the electrode layer 12a since a step difference will arise if they are not substantially the same. The blank pattern layer 24 is comprised of the same material as the later explained green sheet 10a. Further, the blank pattern layer 24 can be formed by the same method as with the electrode layer 12a or the later mentioned green sheet 10a (using blank pattern layer paste).

This blank pattern layer paste is coated at the blank pattern parts 50 between the electrode layers 12a. After this, the electrode layer 12a and blank pattern layer 24 are dried if necessary. The drying temperature is not particularly limited, but preferably is 70 to 120° C., while the drying time is preferably 5 to 15 minutes.

The surfaces of the electrode layer 12a and blank pattern layer 24 are preferably smoothed to a surface roughness (Ra: effective value of surface roughness) of 0.1 μm or less.

Formation of Green Sheet (4) Next, as shown in FIG. 2C, the surfaces of the electrode layer 12a and blank pattern layer 24 are formed with a green sheet 10a forming the dielectric layer 10 shown in FIG. 1 after firing. The green sheet 10a has a thickness of preferably 0.5 to 30 μm, more preferably 0.5 to 10 μm or so.

The method of formation of the green sheet 10a is not particularly limited so long as it is a method able to form the layer uniformly, but in the present embodiment, the case of use of a dielectric paste and use of the doctor blade method is illustrated. The dielectric paste used in the present embodiment usually is comprised of an organic solvent-based paste obtained by kneading a ceramic powder and organic vehicle.

As the ceramic powder, it is possible to suitably select and mix ones from complex oxides or various compounds forming oxides, for example, carbonates, nitrates, hydroxides, and organometallic compounds etc. The ceramic powder usually is used as a powder having an average particle size of 0.4 μm or less, preferably 0.1 to 3.0 μm or so. Further, to form an extremely thin ceramic green sheet, it is preferable to use powder finer than the thickness of the ceramic green sheet.

The organic vehicle contains a binder and a solvent. The binder is not particularly limited, but ethyl cellulsoe, polyvinyl butyral, acryl resin, or another usual binder may be illustrated. The solvent is not particularly limited, but terpineol, alcohol, butyl carbitol, acetone, methylethylketone (MEK), toluene, xylene, ethyl acetate, butyl stearate, isobornyl acetate, or another usual organic solvent may be illustrated.

The different ingredients in the dielectric paste are not particularly limited in content. The usual contents, for example, for a binder, 1 to 5 wt % or so, while for a solvent (or water), 10 to 50 wt % or so is suitable.

The dielectric paste may contain, in accordance with need, additives selected from various dispersion agents, plasticizers, dielectrics, sub ingredient compounds, glass frit, insulators, etc. When adding these additives to the dielectric paste, the total content is preferably made about 10 wt % or less. As the plasticizer, dioctyl phthalate, benzylbutyl phthalate, or other phthalic acid esters, adipic acid, phosphoric acid esters, glycols, etc. may be illustrated. The plasticizer when using a butyral resin as the binder preferably is contained in an amount, with respect to 100 parts by weight of the binder resin, of 25 to 100 parts by weight. If the amount of plasticizer is too small, the green sheet tends to become brittle, while if too great, the plasticizer seeps out and handling is difficult.

The above dielectric paste is used to form a green sheet 10a on the surfaces of the electrode layer 12a and blank pattern layer 24 by the doctor blade method.

Figure 3A:
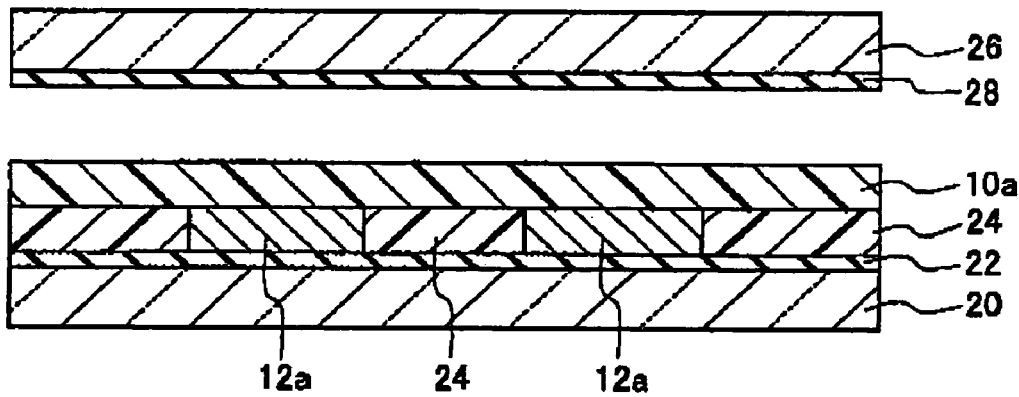
FIG. 3A to FIG. 3C are cross-sectional views of principal parts showing a method of formation of a bonding layer according to an embodiment of the present invention.

Formation of Binder Layer (5) In the present embodiment, next, separate from the above carrier sheet 20, as shown in FIG. 3A, a second support sheet constituted by a carrier sheet 26 may be formed on its surface with a binder layer 28 to prepare a binder layer transfer sheet.

The carrier sheet 26 may be comprised of a sheet of the same material as the carrier sheet 20. The thickness of the binder layer 28 is preferably 0.3 µm or less and further is preferably thinner than the average particle size of the ceramic powder contained in the green sheet 10a. The method of forming the binder layer 28 on the surface of the carrier sheet 26 is not particularly limited so long as it is a method enabling the layer to be formed uniformly, but in the present embodiment, a method using a binder layer paste, for example, the bar coater method, die coater method, reverse coater method, dip coater method, kiss coater method, or other method is used.

The binder layer paste used in the present embodiments contains an organic vehicle and a plasticizer. The organic vehicle contains a binder and solvent. The binder may be the same as or different from the binder contained in the green sheet 10a. The solvent is not particularly limited. As explained above, the usual organic solvents may be used. The plasticizer is not particularly limited, but a phthalic acid ester, adipic acid, phosphoric acid ester, glycols, etc. may be illustrated. The binder layer paste may contain ceramic powder of the same composition as the ceramic powder contained in the green sheet 10a and may further contain an imidazoline-based anti-static agent or other anti-static agent.

The binder layer paste may be formed by kneading the above ingredients by a ball mill etc. to create a slurry.

This binder layer paste is coated on the surface of the second support sheet constituted by the carrier sheet 26 by the above various coating methods, then the binder layer 28 is dried when necessary.

Figure 3B:
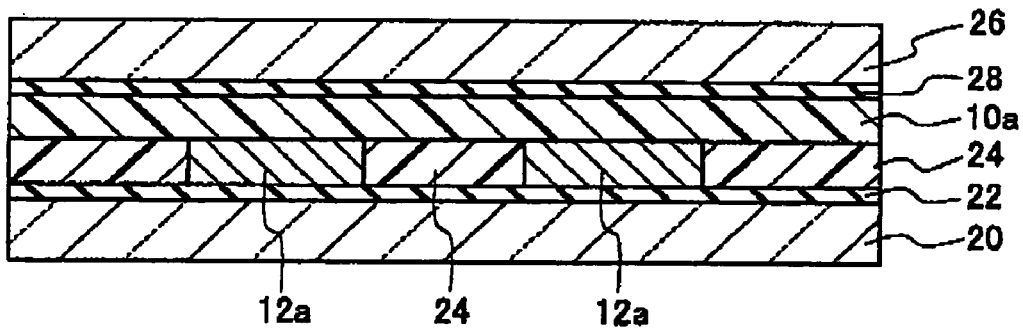
Figure 3C:
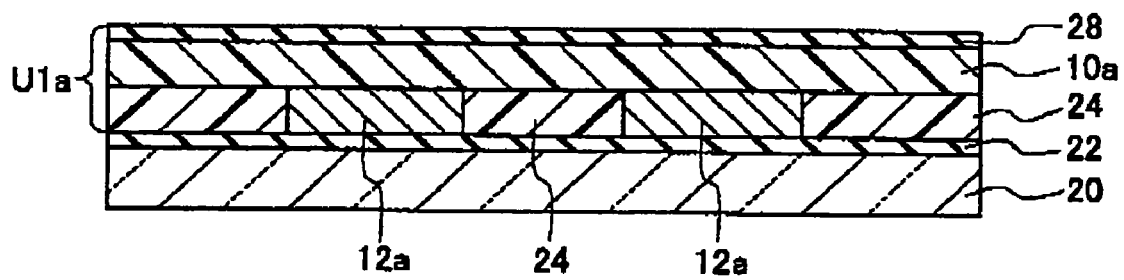

Formation of Laminate Units (6) Next, the green sheet 10a formed with the electrode layer 12a and blank pattern layer 24 shown in FIG. 2C is formed on its surface with a binder layer 28 to obtain a laminate unit U1a shown in FIG. 3C.

In the present embodiment, the transfer method is employed as the method of formation of the binder layer 28. That is, as shown in FIG. 3A and FIG. 3B, the binder layer 28 of the binder layer transfer sheet prepared in the above way is pressed against the surface of the green sheet 10a and hot pressed, then the carrier sheet 26 is peeled off so as to thereby, as shown in FIG. 3C, transfer the binder layer 28 to the surface of the green sheet 10a and obtain the laminate unit U1a. By forming the binder layer 28 by the transfer method, it is possible to effectively prevent the ingredients of the binder layer from seeping to the green sheet 10a or electrode layer 12a or blank pattern layer 24. Therefore, the composition of the green sheet 10a or electrode layer 12a or blank pattern layer 24 is not liable to be adversely affected. Further, even when forming the binder layer 28 thin, since the ingredients of the binder layer will not seep to the green sheet 10a or electrode layer 12a or blank pattern layer 24, the bondability can be kept high.

The heating temperature at the time of transfer is preferably 40 to 100° C. Further, the pressing strength is preferably 0.2 to 15 MPa. The pressing operation may be pressing by a press or pressing by calendar rolls, but pressing by a pair of rolls is preferable.

Formation of Green Chip (7) Next, a plurality of the obtained laminate units U1a are stacked to form a green chip.

In the present embodiment, the laminate units U1a are stacked, as shown in FIG. 4A, FIG. 4B and FIG. 5A, FIG. 5B, by bonding different laminate units through the binder layers 28. Below, the method of stacking will be explained.

Figure 4A:
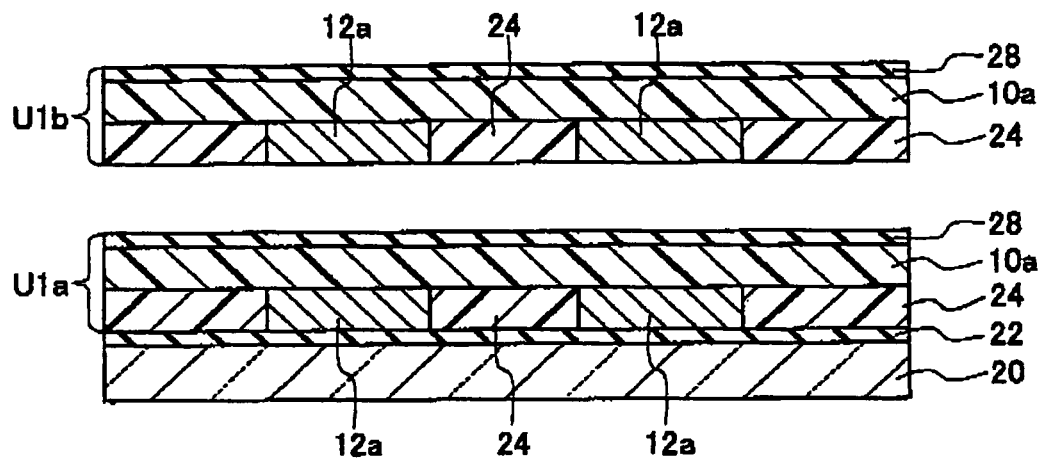
FIG. 4A, FIG. 4B, FIG. 5A, and FIG. 5B are cross-sectional views of principal parts showing a method of stacking green sheets having electrode layers according to an embodiment of the present invention.

First, as shown in FIG. 4A, the above prepared laminate units U1a and other laminate units U1b prepared by the same method as the laminate unit U1a are prepared. Next, the carrier sheet 20 is peeled off a laminate unit U1b to create a state where the laminate unit U1b has the carrier sheet 20 peeled off. In the present embodiment, the laminate unit U1b is formed on the carrier sheet 20 via the peeling layer 22, so the carrier sheet 20 can be easily and excellently peeled off the laminate unit U1b. Further, at the time of peeling, the electrode layer 12a and the blank pattern layer 24 will not be damaged. Further, the peeling layer 22 is preferably peeled off from the laminate unit U1b together with the carrier sheet 20, but may remain on the laminate unit U1b side without problem so long as to a small extent. In this case as well, the remaining peeling layer 22 is sufficiently thin compared with the green sheet 10a and the electrode layer 12a. Further, the dielectric contained in the peeling layer 22 forms part of the dielectric layer 10 after firing in the same way as the green sheet 10a, so does not become a problem.

Figure 4B:
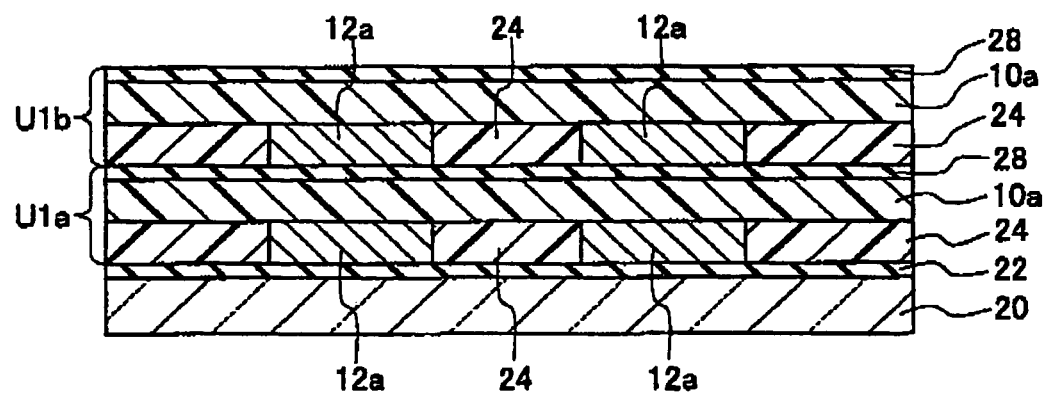
Figure 5A:
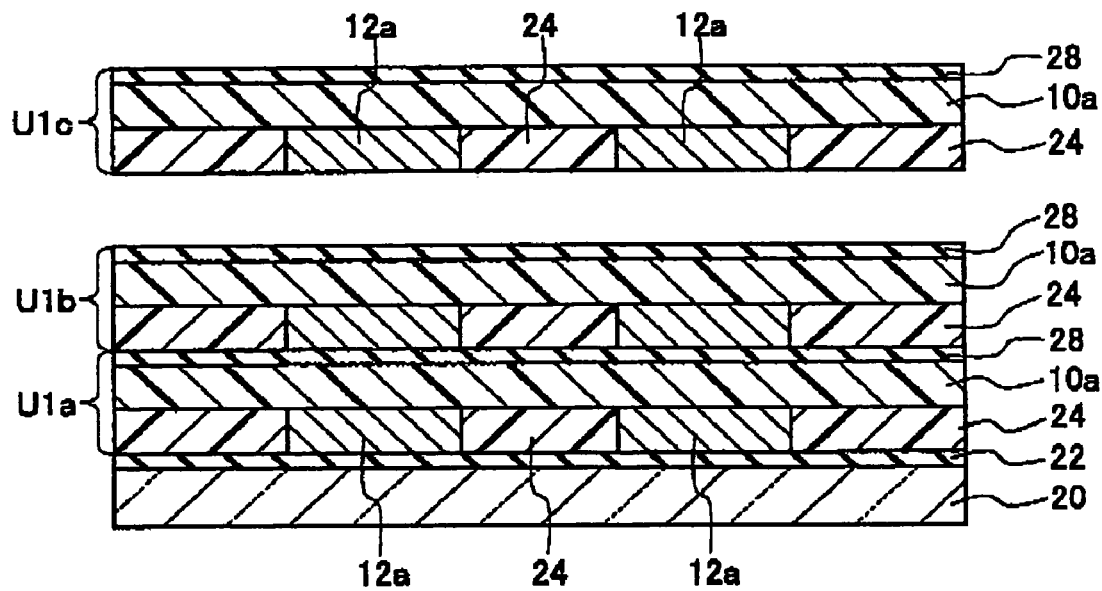
Figure 5B:
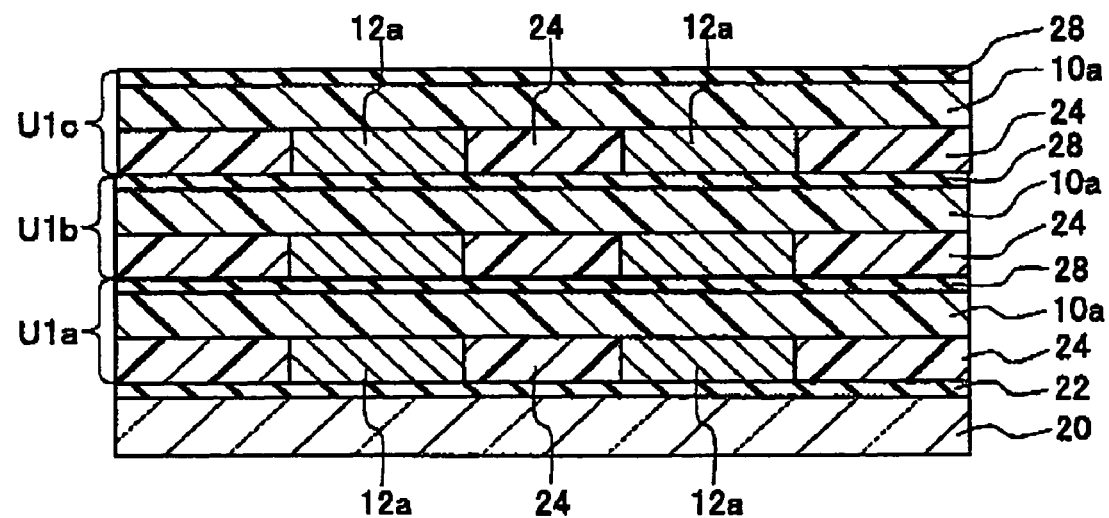

Next, as shown in FIG. 4B, the laminate unit U1b from which the carrier sheet 20 has been peeled off and the laminate unit U1a are bonded and stacked via the binder layer 28 of the laminate unit U1a. Next, as shown in FIG. 5A and FIG. 5B, in the same way, another laminate unit U1C is bonded and stacked on the laminate unit U1b via the binder layer 28 of the laminate unit U1b. The steps shown in FIG. 5A and FIG. 5B are repeated to stack a plurality of laminate units.

Finally, an external layer green sheet is stacked on the top surface and/or bottom surface of this laminate and a final pressing operation performed, then the laminate is cut into a predetermined size to form a green chip. Further, the pressure at the time of the final pressing operation is preferably made 10 to 200 MPa, while the heating temperature is preferably made 40 to 100° C.

Firing of Green Chip Etc.

(8) The obtained green chip is treated to remove the binder, fired, and, as needed, heat treated to cause the dielectric layer to reoxidize. Further, the capacitor body 4 comprised of the formed sintered body is printed or transferred with an external electrode paste and fired to form the external electrodes 6, 8 and produce a multilayer ceramic capacitor 2. The produced multilayer ceramic capacitor 2 is mounted on a printed circuit board by soldering etc. and used for various types of electronic apparatuses etc.

Actions of Embodiments

If using the peeling layer paste produced in the present embodiment, it is possible to form a peeling layer 22 not susceptible to sheet attack for the electrode layer paste for forming the electrode layer 12*a* and the blank pattern layer paste for forming the blank pattern layer 24.

The peeling layer paste produced in the present embodiment is free from partial coagulation of the ceramic powder and superior in dispersability. Therefore, not only is the peeling layer 22 formed uniform in thickness, but also the peeling layer 22 can be made smoother on its surface.

The peeling layer paste produced in the present embodiment has a low nonvolatile concentration comprised of ingredients other than the dispersion medium. Therefore, it becomes possible to form a peeling layer 22 of an extremely thin 0.2 μm or less.

The peeling layer formed using the peeling layer paste 22 produced in the present embodiment is smoothed on its surface. Therefore, it is possible to reduce the surface roughness of the electrode coating at the time of stacking, suppress the occurrence of defects (structural defects) at the time of stacking, and reduce the short-circuit defects of the finally obtained multilayer ceramic capacitor 2.

Other Embodiments

Above, an embodiment of the present invention was explained, but the present invention is not limited to the above embodiment in any way and can be modified in various ways within the scope of the present invention.

For example, the method of the present invention is not limited to the method of production of a multilayer ceramic capacitor and can also be applied as a method of production of another multilayer type electronic device.

The method of formation of the binder layer 28 is not limited to the transfer method. Rather than coating the binder layer paste on the surface of the second support sheet constituted by the carrier sheet 26, it is also possible to directly coat it on the green sheet 10*a* and then dry it to form the binder layer 28.

Figure 6A:
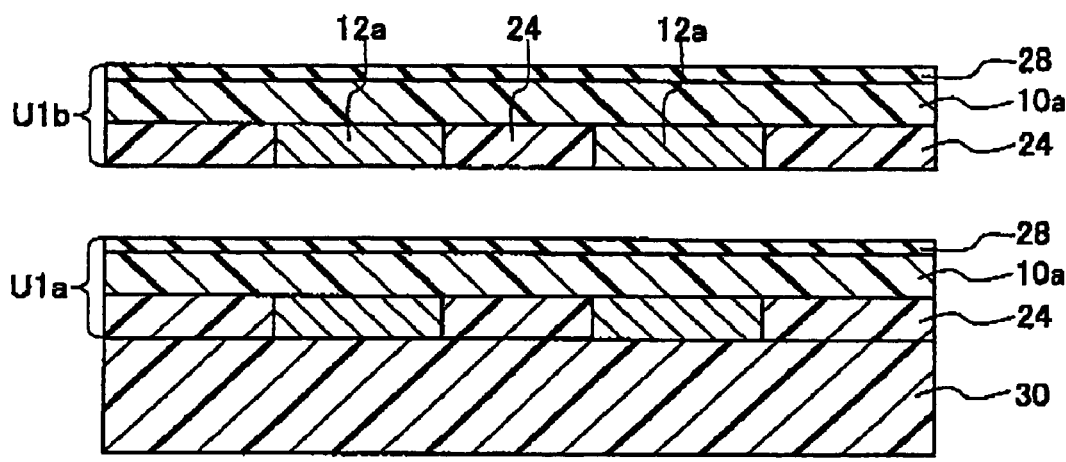
FIG. 6A and FIG. 6B are cross-sectional views of principal parts showing a method of stacking green sheets having electrode layers according to another embodiment of the present invention.
Figure 6B:
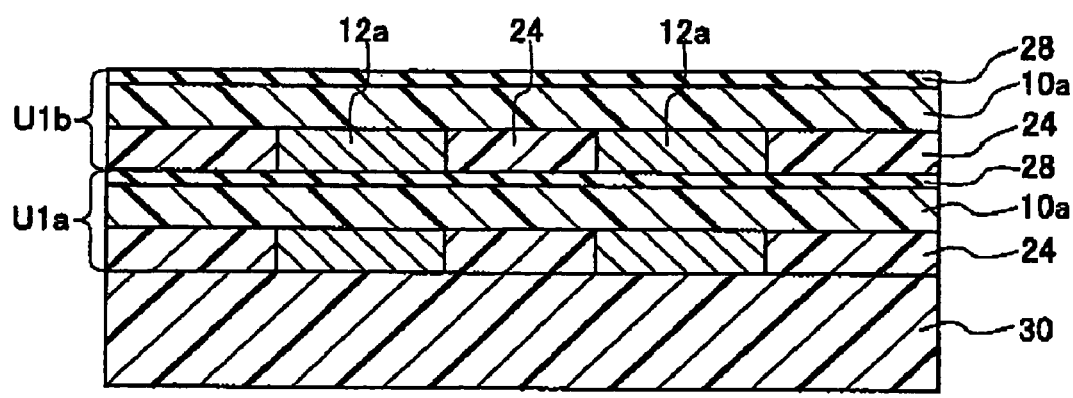

The method of stacking the laminate units, as shown in FIG. 6, may also comprise peeling off the carrier sheets 20 from the laminate units U1*a* in advance and then stacking the laminate units U1*a* on an external layer green sheet 30 (thick stack comprised of plurality of stacked green sheets on which electrode layers are not formed).

Figure 8A:
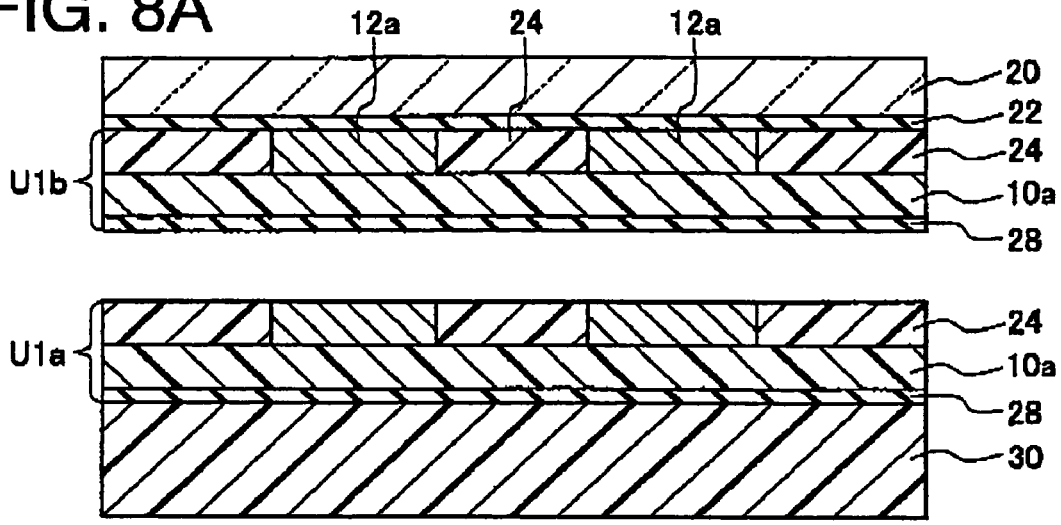
Figure 8B:
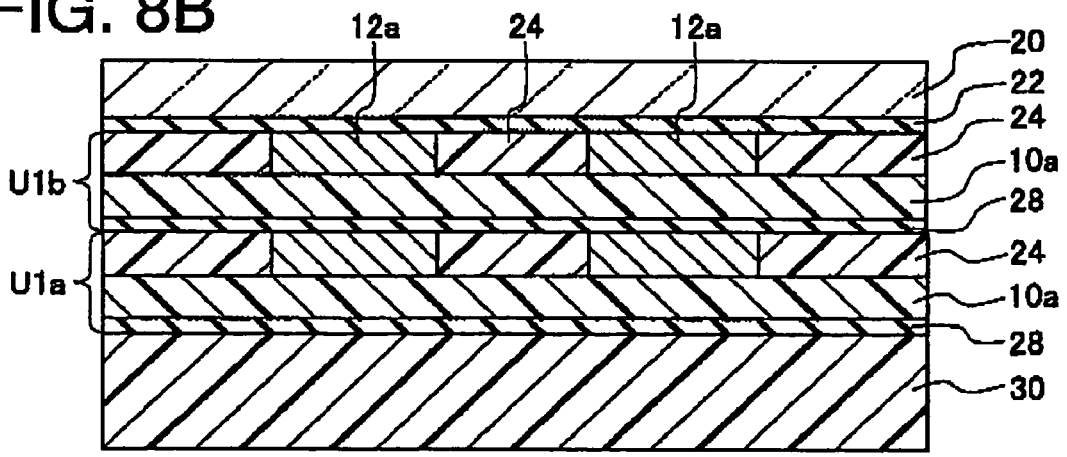
Figure 8C:
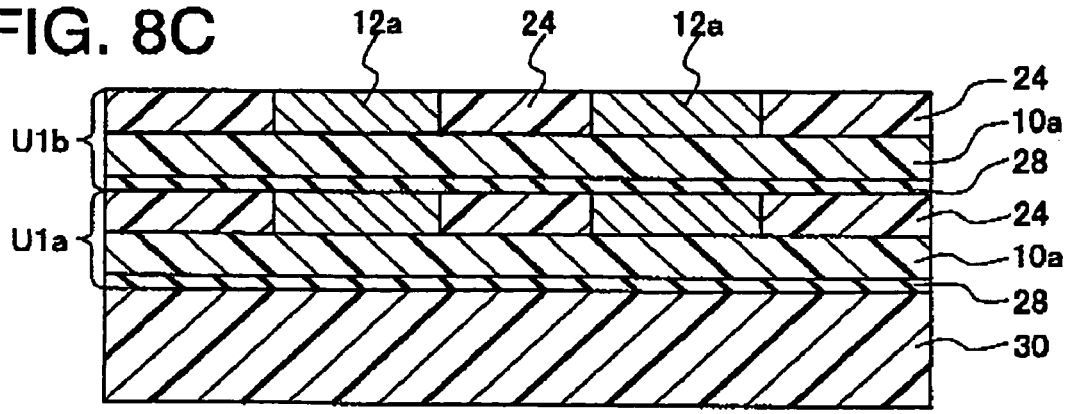

Further, the method of stacking the laminate units, for example as shown in FIG. 7 and FIG. 8, may also comprise stacking each laminate unit, then peeling off the carrier sheet 20. That is, as shown in FIG. 7A, FIG. 7B, first, the external layer green sheet 30 is overlaid with a laminate unit U1*a* from which the carrier sheet 20 has not been peeled off and is bonded and stacked with it through the binder layer 28. Next, as shown in FIG. 7C, the carrier sheet 20 is peeled off the laminate unit U1*a*. Next, as shown in FIG. 8A to FIG. 8C, the same procedure is used to bond and stack on the laminate unit U1*a* another laminate unit U1*b* through the binder layer 28 of the laminate unit U1*b*. The process shown in FIG. 8A to FIG. 8C is then repeated to stack a plurality of laminate units. Next, the top of the stack is covered with another external layer green sheet and finally pressed. After this, the stack may be cut to a predetermined size to form a green chip. Further, when employing the process shown in FIG. 7 and FIG. 8, it is possible to make the bonding strength of the binder layer 28 stronger than the tackiness of the peeling layer 22 so as to selectively and easily peel off the carrier sheet 20, so this is particularly effective.

EXAMPLES

Below, the present invention will be explained further based on detailed examples, but the present invention is not limited to these examples.

Example 1

Preparation of Peeling Layer Paste

Preparation of Additive Slurry

First, as the additive (sub ingredient) materials, (Ba, Ca)SiO$_3$ in an amount of 1.48 parts by weight, Y$_2$O$_3$ in 1.01 parts by weight, MgCO$_3$ in 0.72 part by weight, MnO in 0.13 part by weight, and V$_2$O$_5$ in 0.045 part by weight were prepared. Next, the prepared additive (sub ingredient) materials were mixed to obtain an additive (sub ingredient) material mixture. Next, the obtained additive material mixture in an amount of 3.39 parts by weight, ethyl alcohol in 6.2 parts by weight, n-propanol in 6.2 parts by weight, xylene in 2.1 parts by weight, and a polyethylene glycol-based dispersion agent in 0.04 part by weight were mixed and pulverized using a ball mill to obtain an additive slurry. The mixing and pulverization were performed using a 250 cc polyethylene resin vessel charged with 450 g of 2 mm φ ZrO$_2$ media under conditions of a peripheral speed of 45 m/min for 20 hours. The particle size of the additive materials after pulverization was a median size of about 0.1 μm.

Preparation of Primary Slurry

Next, the entire amount of the obtained additive slurry, BaTiO$_3$ powder of an average particle size of 0.1 μm (BT-01/Sakai Chemical Industry) in an amount of 100 parts by weight, ethyl alcohol in 30.8 parts by weight, n-propanol in 30.8 parts by weight, xylene in 20.2 parts by weight, a dioctyl phthalate (DOP) plasticizer in 3.0 parts by weight, a mineral spirit in 7.0 parts by weight, and a polyethylene glycol-based dispersion agent in 1.0 part by weight were mixed and pulverized using a ball mill. The mixing and pulverization were performed using a 1 liter polyethylene resin vessel charged with 1.8 kg of 2 mm φ ZrO$_2$ media under conditions of a peripheral speed of 45 m/min for 4 hours.

After this (after mixing for 4 hours), a 15% resin solid concentration lacquer comprised of a polyvinyl butyral (PVB) resin (polymerization degree of 1450, butyralization degree of 69%, amount of residual acetyl groups of 12%) dissolved in ethyl alcohol:n-propanol=1:1 was additionally added in an amount of 41.6 parts by weight (added to give amount of addition of polyvinyl butyral resin, with respect to 100 parts by weight of powder (barium titanate+additive), of 6 parts by weight) and the mixture was further mixed for 16 hours by a ball mill to obtain a primary slurry. The obtained primary slurry had a nonvolatile concentration of 41.3 wt %.

Further, in this example, the above mixture of the BaTiO$_3$ powder and additive materials was used as the ceramic powder (average particle size 0.1 μm)

Dilution of Primary Slurry

Next, the entire amount of the obtained primary slurry was mixed with the following prepared binder-lacquer solution using a ball mill to give a total amount of addition of the polyvinyl butyral resin, with respect to 100 parts by weight of the ceramic powder, of 24 parts by weight and a nonvolatile concentration of 10 wt % so as to obtain a secondary slurry. The mixing was performed using a 3-liter polyethylene resin vessel under conditions of a peripheral speed of 45 m/min for 4 hours. Further, the binder-lacquer was prepared by preparing and mixing ethyl alcohol in an amount of 239.9 parts by weight, n-propanol in 239.9 parts by weight, xylene in 91.7 parts by weight, a dioctyl phthalate (DOP) plasticizer in 3.6 parts by weight, and a PVB-15% lacquer in 45.8 parts by weight and heating the mixture to dissolve.

The obtained secondary slurry had a nonvolatile concentration of 10 wt %, an amount of PVB resin with respect to 100 parts by weight of the ceramic powder of 24 parts by weight, and a content of the plasticizer, with respect to 100 parts by weight of the PVB resin, of 50 parts by weight (5 parts by weight with respect to 100 parts by weight of the ceramic powder).

High Pressure Dispersion Treatment

The obtained secondary slurry was treated using a wet jet mill (Sugino Machine, Ultimizer HJP-25005) so as to prepare a peeling layer paste (Table 1, Sample 4). The treatment conditions were a pressure of 100 MPa and a flow rate of 450 m/s. The treatment was performed once. The shear rate on the secondary slurry at this time was measured under conditions of a nozzle diameter of 0.1 mm and a flow rate of 450 m/s and as a result was found to be about $9 \times 10^6$ (1/s).

Formation of Peeling Layer

The prepared peeling layer paste was coated by a bar coater (#2) at a coating rate of 4/min on the surface of a 38 µm thick PET film treated for release (peeling strength: 10.5 mN/cm) by coating its surface with a peeling agent mainly comprised of silicone (first support sheet), then was dried in a drying oven with an oven temperature of 60° C. for 1 minute so as to form a peeling layer. The peeling layer was measured for dry thickness, whereupon it was found to be 0.12 µm, i.e., a thin layer could be formed.

Evaluation of Peeling Layer

Surface Conditions

Figure 9B:
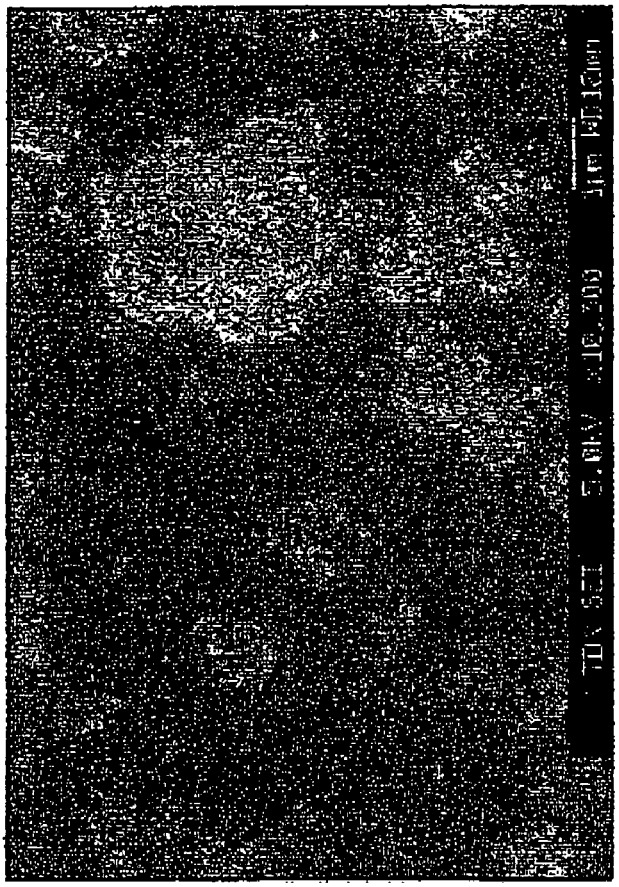
FIG. 9B is an SEM photograph showing the surface conditions of the peeling layer of Comparative Example 1.
Figure 9A:
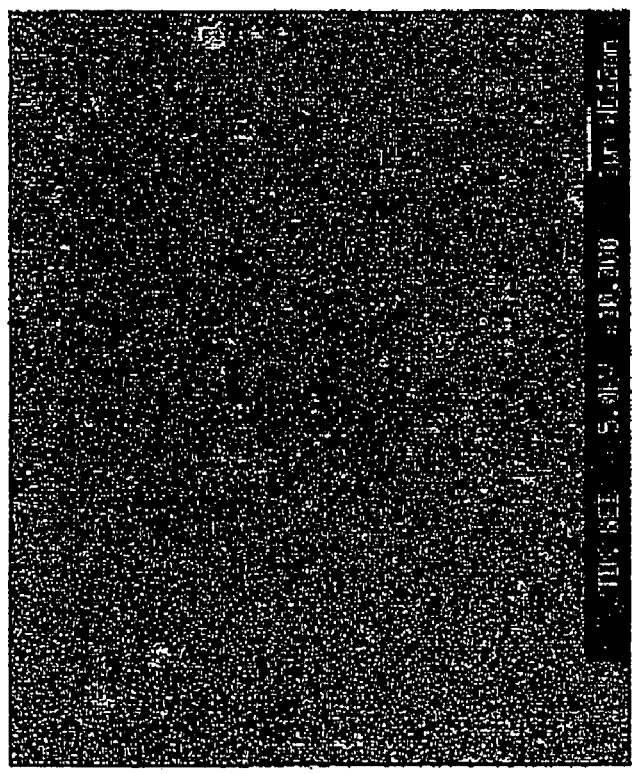

The formed peeling layer was examined for its surface conditions by an SEM to confirm the state of dispersion of the pigment. The SEM photograph is shown in FIG. 9A. As shown in FIG. 9A, no coarse grains or coagulate was observed at all, It could be confirmed that the surface conditions were extremely good.

Surface Roughness

The surface roughness was evaluated by printing the surface of the peeling layer with the electrode layer paste and blank pattern layer paste to form an electrode layer and blank pattern layer, then measuring the surfaces of the electrode layer and blank pattern for surface roughness (Ra: effective value of surface roughness) using a Kosaka Laboratories "Surfcorder (SE-30D)".

Figure 10A:
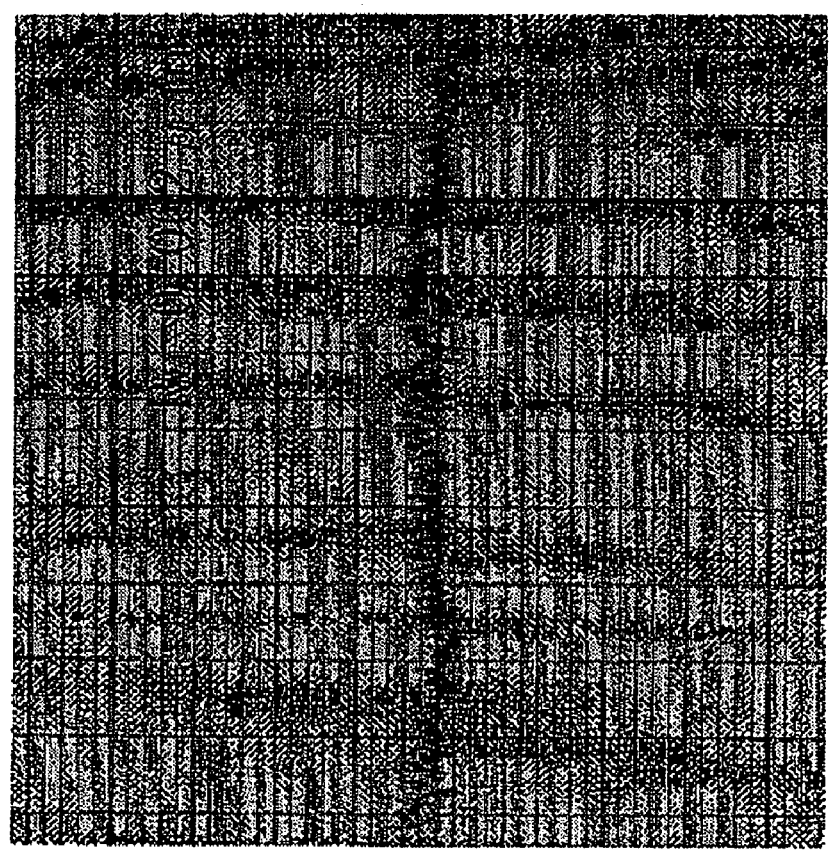
FIG. 10A is a graph showing a roughness curve of an electrode layer or blank pattern layer formed on the surface of the peeling layer of Example 1.

Specifically, first, the surface of the peeling layer was printed with an Ni electrode paste comprised of a binder constituted by polyvinyl butyral (PVB) and a solvent constituted by terpineol (electrode layer paste) to give an Ni metal deposition of 0.55 mg/cm² by a screen printing machine and dried at 90° C. for 2 minutes to form a predetermined pattern of an electrode layer 12a with a 1 µm dry thickness. Next, the parts on the surface of the peeling layer where the electrode layer 12a was not formed were printed with a BaTiO₃ paste comprised of a binder constituted by polyvinyl butyral (PVB) and a solvent constituted by terpineol (blank pattern layer paste) by a screen printing machine to give a BaTiO₃ deposition of 0.43 mg/cm², then dried at 90° C. for 2 minutes to form blank patterns. The blank patterns were printed using the patterns used when printing the above electrode layer paste and the screen printing plate serving as the auxiliary patterns. The blank patterns were formed so that the dry thickness became the same thickness as the electrode layer. After this, the surfaces of the electrode layer and blank pattern layer formed on the peeling layer were measured for surface roughness (Ra). The roughness curve is shown in FIG. 10A. As shown in FIG. 10A, Ra=0.062 µm, i.e., it could be confirmed that the surface conditions were extremely close to smooth in state. The above results are shown together in Table 1.

Example 2

Except for changing the composition of the binder-lacquer solution added when diluting the primary slurry and changing the amount of PVB resin with respect to 100 parts by weight of the ceramic powder in the secondary slurry as shown in Table 1 (to 6 parts by weight, 12 parts by weight, 18 parts by weight, 50 parts by weight, and 75 parts by weight), the same procedure was followed as in Example 1 to prepare different peeling layer pastes (Table 1, Samples 1 to 3, 5, and 6).

Formation of Peeling Layer

Each prepared peeling layer paste was coated under the same conditions as in Example 1 to form a peeling layer. The peeling layer was measured for dry thickness, whereupon it was found to be 0.2 µm or less in each case, i.e., a thin layer could be formed.

Evaluation of Peeling Layer

Surface Conditions

Each formed peeling layer was examined for surface conditions in the same way as in Example 1 and the state of dispersion of the pigment was confirmed, whereupon in each sample, no coarse grains or coagulate at all could be observed, i.e., it could be confirmed that the surface conditions were extremely good.

Surface Roughness

The same procedure was followed as in Example 1 to print the surface of each peeling layer with an electrode layer paste and blank pattern layer paste to form an electrode layer and blank pattern layer, then measure the surfaces of the electrode layer and blank patterns for surface roughness (Ra), whereupon in each sample, Ra=0.1 µm or less, i.e., it could be confirmed that the surface conditions were extremely close to smooth in state. The above results are shown together in Table 1.

TABLE 1

| Sample | | High press. disp. treat. | Amount of binder (parts by weight) | Nonvol. conc. (wt %) | Thick. (µm) | Surface rough. Ra (µm) | Capacitor sample Short-circuit rate |
|---|---|---|---|---|---|---|---|
| | | | Peeling layer paste | | Peeling layer | | |
| 1 | Comp. ex. | Yes | 6 | 10 | 0.13 | 0.059 | *— |
| 2 | Ex. | Yes | 12 | 10 | 0.12 | 0.054 | 10 |

TABLE 1-continued

|  |  | Peeling layer paste | | | Peeling layer | | Capacitor sample |
|---|---|---|---|---|---|---|---|
|  |  | High press. disp. | Amount of binder (parts by | Nonvol. conc. | Thick. | Surface rough. | Short-circuit |
| Sample | | treat. | weight) | (wt %) | (μm) | Ra (μm) | rate |
| 3 | Ex. | Yes | 18 | 10 | 0.11 | 0.061 | 7 |
| 4 | Ex. | Yes | 24 | 10 | 0.12 | 0.062 | 6 |
| 5 | Ex. | Yes | 50 | 10 | 0.11 | 0.066 | 7 |
| 6 | Ref. ex. | Yes | 75 | 10 | 0.10 | 0.066 | **100 |
| 7 | Comp. ex. | No | 24 | 10 | 0.13 | 0.132 | 80 |

The "*—" in the table indicates that an attempt was made to print the surface of the peeling layer formed with electrode layer paste so as to form an electrode layer, but printing was not possible and a capacitor could not be fabricated.
The "**100" in the table indicates that delamination occurred in the capcitor sample.

Example 3

Except for changing the composition of the binder-lacquer solution added when diluting the primary slurry and changing the nonvolatile concentration in the secondary slurry as shown in Table 2 (to 3 wt %, 5 wt %, 7 wt %, 15 wt %, and 17 wt %), the same procedure was followed as in Example 1 to prepare different peeling layer pastes (Table 2, Samples 8 to 12).

Formation of Peeling Layer

Each prepared peeling layer paste was coated under the same conditions as in Example 1 to form a peeling layer. The peeling layer was measured for dry thickness, whereupon it was found to be, with the exception of Sample 12, 0.2 μm or less in all cases, i.e., a thin layer could be formed. For Sample 12, probably the peeling layer increased in dry thickness since the nonvolatile concentration was too high.

Evaluation of Peeling Layer

Surface Conditions

The formed peeling layer was examined for surface conditions by an SEM in the same way as in Example 1 to confirm the state of dispersion of the pigment, whereupon, for each sample, no coarse grains or coagulate could be observed at all and it could be confirmed that the surface conditions were extremely good.

Surface Roughness

In the same way as in Example 1, each peeling layer was printed on its surface with an electrode layer paste and blank pattern layer paste to form an electrode layer and blank pattern layers and the surfaces of the electrode layer and blank pattern were measured for surface roughness (Ra), whereupon, for each sample, Ra=0.1 μm or less, i.e., it could be confirmed that the surface conditions were extremely close to smooth. The above results are shown together in Table 2.

TABLE 2

|  |  | Peeling layer paste | | | Peeling layer | | Capacitor sample |
|---|---|---|---|---|---|---|---|
|  |  | High press. disp. | Amount of binder (parts by | Nonvol. conc. | Thick. | Surface rough. | Short-circuit |
| Sample | | treat. | weight) | (wt %) | (μm) | Ra (μm) | rate |
| 8 | Ref. ex. | Yes | 24 | 3 | 0.09 | 0.093 | *— |
| 9 | Ex. | Yes | 24 | 5 | 0.11 | 0.087 | 10 |
| 10 | Ex. | Yes | 24 | 7 | 0.12 | 0.074 | 7 |
| 4 | Ex. | Yes | 24 | 10 | 0.12 | 0.062 | 6 |
| 11 | Ex. | Yes | 24 | 15 | 0.15 | 0.062 | 6 |
| 12 | Comp. ex. | Yes | 24 | 17 | 0.24 | 0.058 | 5 |

The "*—" in the table indicates that an attempt was made to print the surface of the peeling layer formed with electrode layer paste so as to form an electrode layer, but printing was not possible and a capacitor could not be fabricated.

Comparative Example 1

The same procedure was followed as in Example 1 to prepare the peeling layer paste except for not performing the high pressure dispersion treatment (Table 1, Sample 7). The prepared peeling layer paste was coated under the same conditions as in Example 1 to form a peeling layer. The peeling layer was measured for dry thickness, whereupon it was found to be 0.13 μm, i.e., a thin layer could be formed.

Evaluation of Peeling Layer

Surface Conditions

The formed peeling layer was examined for its surface conditions by an SEM in the same way as in Example 1 to confirm the state of dispersion of the pigment. The SEM photograph is shown in FIG. 9B. As shown in FIG. 9B, coarse grains and coagulate were observed. In this way, it could be confirmed that even when, like in this comparative example, dispersing paste with an extremely low nonvolatile concentration of 10% by just the medium-type dispersion method, the dispersability was not improved.

Further, the size of the coagulated part was calculated, whereupon it was found to be a diameter of about 3 μm. As a result, in this comparative example, it could be confirmed that the peeling layer had thicknesses of as much as 3 μm in certain parts.

Surface Roughness

Figure 10B:
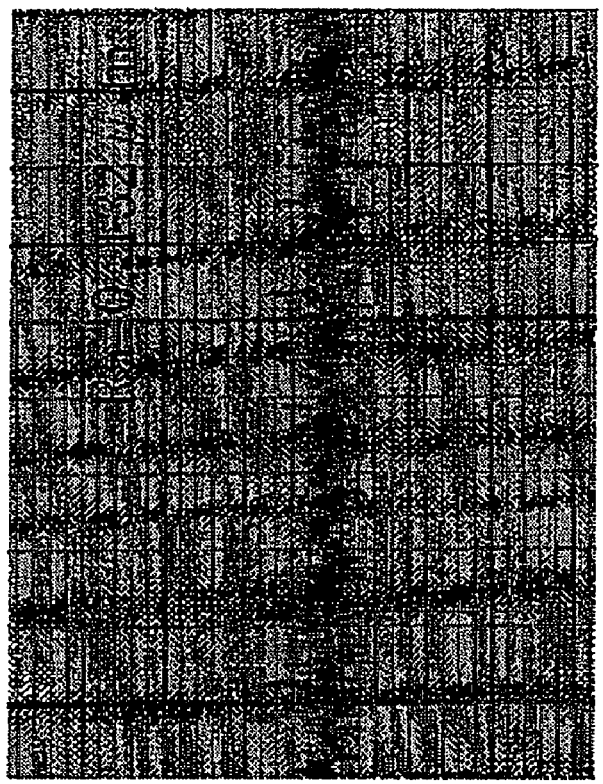
FIG. 10B is a graph showing a roughness curve of an electrode layer or blank pattern layer formed on the surface of the peeling layer of Comparative Example 1.

In the same way as in Example 1, each peeling layer was printed on its surface with the electrode layer paste and blank pattern layer paste to form an electrode layer and blank pattern layer, then the surfaces of the electrode layer and blank patterns were measured for surface roughness (Ra). The roughness curve is shown in FIG. 10B. As shown in FIG. 10B, Ra=0.132 μm. It could be confirmed that compared with the case of Example 1, the surface conditions deteriorated. The results are shown in Table 1.

Example 4

Green Sheet Paste

First, an additive (sub ingredient) material mixture of the same composition as Example 1 was prepared.

Next, the obtained additive material mixture in an amount of 4.3 parts by weight, ethyl alcohol in 3.11 parts by weight, n-propanol in 3.11 parts by weight, xylene in 1.11 parts by weight, and a dispersion agent in 0.04 part by weight were mixed and pulverized using a ball mill to obtain an additive slurry. The mixing and pulverization were performed using a 250 cc polyethylene resin vessel, charging it with 450 g of 2 mm φ $ZrO_2$ media, and operating it at a peripheral speed of 45 m/min for 16 hours. Further, the additive material after pulverization had a particle size of a median size of 0.1 μm.

Next, the obtained additive slurry in an amount of 11.65 parts by weight, $BaTiO_3$ powder (BT-02/Sakai Chemical Industry) in 100 parts by weight, ethyl alcohol in 35.32 parts by weight, n-propanol in 35.32 parts by weight, xylene in 16.32 parts by weight, dioctyl phthalate (plasticizer) in 2.61 parts by weight, a mineral spirit in 7.3 parts by weight, a dispersion agent in 2.36 parts by weight, an anti-static aid in 0.42 part by weight, an organic vehicle in 33.74 parts by weight, MEK in 43.81 parts by weight, and 2-butoxyethanol in 43.81 parts by weight were mixed using a ball mill to obtain a green sheet paste.

Further, the mixing by the ball mill was performed using a 500 cc polyethylene resin vessel, charging it with 900 g of 2 mm φ $ZrO_2$ media, and operating it under conditions of a peripheral speed of 45 m/min for 20 hours. Further, the above organic vehicle was prepared by stirring and dissolving a polyvinyl butyral resin having a polymerization degree of 1450 and a butyralization degree of 69% (made by Sekisui Chemical Industry) in an amount of 15 parts by weight into ethanol in 42.5 parts by weight and propanol in 42.5 parts by weight at a temperature of 50° C. That is, the resin content in the organic vehicle (amount of polyvinyl butyral resin) was made 15 wt %.

Binder Layer Paste

A butyral resin (polymerization degree of 800, butyralization degree of 77%) in an amount of 2 parts by weight, MEK (methyl ethyl ketone) in 98 parts by weight, and DOP (dioctyl phthalate) in 1 part by weight were stirred to dissolve to prepare a binder layer paste.

Preparation of Samples of Multilayer Ceramic Capacitors

The peeling layer pastes, electrode layer pastes, and blank pattern layer pastes prepared in Examples 1 to 3 and the green sheet paste and binder layer paste prepared in this example were used in the following way to produce multilayer ceramic capacitors 2 shown in FIG. 1.

Formation of Green Sheet

First, in the same way as Examples 1 to 3, a PET film was formed with each peeling layer (to a dry thickness of 0.1 μm or less), and the peeling layer was formed on its surface with an electrode layer and blank pattern layer (to dry thickness of 1 μm). When trying to print the surface of the peeling layer formed using a peeling layer paste corresponding to Sample 1 of Example 2 (amount of PVB resin, with respect to 100 parts by weight of ceramic powder in secondary slurry, being small 6 parts by weight) and a peeling layer paste corresponding to Sample 8 of Example 3 (nonvolatile concentration in secondary slurry being small as 3%) with electrode layer paste to form an electrode layer, printing was not possible. The reason is believed to be that if the amount of binder is small, the strength of the peeling layer seriously falls, the peeling layer becomes easily scratched or torn, the printability of the paste falls, and thereby formation of the electrode layer on the peeling layer becomes difficult.

Next, the electrode layer and blank pattern formed on the surface of the peeling layer formed using each peeling layer paste corresponding the the samples other than Sample 1 of Example 2 and the samples other than Sample 8 of Example 3 were coated with the above green sheet paste by a die coater, then dried to form a green sheet and obtain a green sheet 10a having an electrode layer 12a and blank pattern 24. The cooling rate was made 50 m/min, and the drying was performed using a drying oven with an oven temperature of 80° C. The green sheets were formed to give thicknesses when dry of 1 μm.

Formation of Binder Layer and Transfer of Binder Layer

First, another PET film (second support sheet) was prepared. This PET film was coated with the above binder layer paste by a die coater, then dried to form a binder layer. The coating speed was made 70 m/min, while the drying was performed using a drying oven with an oven temperature of 80° C. The binder layer was formed to give a thickness after drying of 0.1 μm. Further, the second support sheet, unlike the first support sheet, was treated on its surface with a silicone-based resin to facilitate peeling.

Next, the binder layer 28 was transferred onto the green sheet 10a having the electrode layer 12a and blank pattern 24 by the method shown in FIG. 3 to form a laminate unit U1a. At the time of transfer, a pair of rolls was used. The pressing force was made 0.1 MPa, the transfer temperature 80° C., and the transfer speed 2 m/min. It was confirmed that the transfer could be performed well Preparation of Green Chip First, a plurality of external layer green sheets formed to thicknesses of 10 μm were stacked to give a thickness at the time of stacking of about 50 μm so as to form an external layer forming the cap part (cover layer) of the multilayer capacitor after firing. Further, the external layer green sheets were green sheets formed using the above produced green sheet coating to give a thickness after drying of 10 μm.

Next, the method shown in FIG. 3 and FIG. 4 was used to stack 100 of the above produced laminate units. Further, a plurality of external layer green sheets formed to thicknesses of 10 μm were stacked to give a thickness at the time of stacking of about 50 μm so as to form an external layer forming the cap part (cover layer) of the multilayer capacitor after firing. Further, the obtained laminate was pressed under conditions of 100 MPa and 70° C., then cut by a dicing machine to obtain a pre-fired green chip.

Preparation of Sintered Body

Next, the final laminate was cut to a predetermined size and treated to remove the binder, fire it, and anneal it (heat treat it) so as to prepare a chip-shaped sintered body. The binder was removed at a temperature elevation rate of 50° C./hour, a holding temperature of 240° C., a holding time of 8 hours, and an atmospheric gas of the air. The firing was performed at a temperature elevation rate of 300° C./hour, a holding temperature of 1200° C., a holding time of 2 hours, a cooling rate of 300° C./hour, and an atmospheric gas of a mixed gas of $N_2$ gas controlled to a dew point of 20° C. and $H_2$ (5%). The annealing (reoxidation) was performed at a holding time of 3 hours, a cooling rate of 300° C./hour, and an atmospheric gas of $N_2$ gas controlled to a dew point of 20° C. Further, the atmospheric gas was wet using a wetter at a water temperature of 0 to 75° C.

Next, the end faces of the chip-shaped sintered body were polished by sand blasting, then an In—Ga alloy psate was coated on the ends and then fired to form external electrodes and obtain a sample of a multilayer ceramic capacitor of the configuration shown in FIG. 1.

Measurement of Short-Circuit Defect Rate

The short-circuit defect rate was measured by preparing 50 capacitor samples and investigating the number at which short-circuit defects occurred. Specifically, an insulation resistance meter (Hewlett Packard E2377A Multimeter) was used to measure the resistance values. Samples with resistance values of 10 kΩ or less were deemed as short-circuit defect samples. The ratio of short-circuit defect samples to all measured samples was defined as the short-circuit defect rate. In this example, a short-circuit defect rate of 10% or less was deemed as good. As a result, the short-circuit defect rate, as shown in Table 1 and Table 2, was less than 10%, that is, good results were obtained, for all except Sample 6. The short-circuit defect rate is low in this way probably because of the good surface conditions of the peeling layer under the electrode layer. That is, it could be confirmed that by being able to make the surface roughness of the electrode layer smaller, it is possible to greatly reduce the short-circuit defect rate of the capacitor samples. Note that Sample 6 had a short-circuit rate of 100% probably because the amount of binder in the peeling layer was too great and as a result internal cracks occurred at the time of firing and delamination occurred.

Comparative Example 2

The same procedure was followed as in Example 4 to obtain samples of multilayer ceramic capacitors except for forming the peeling layer using the peeling layer paste of Comparative Example 1 (Table 1, Sample 7). Further, the same procedure was followed as in Example 4 to measure the short-circuit defect rate. As a result, the short-circuit defect rate was 80%. The significance of Example 4 could therefore be confirmed.

The invention claimed is:

1. A method of production of a peeling layer paste used for producing a multilayer electronic device,
   the method of production of a peeling layer paste having:
   a step of preparing a primary slurry containing a ceramic powder having an average particle size of 0.1 μm or less, a binder, and a dispersion agent and having a nonvolatile concentration of 30 wt % or more,
   a step of adding to said primary slurry a binder-lacquer solution to dilute said primary slurry to prepare a secondary slurry having a nonvolatile concentration of 15 wt % or less and a content of said binder of 12 parts by weight or more with respect to 100 parts by weight of said ceramic powder, and
   a high pressure dispersion treatment step of running said secondary slurry through a wet jet mill to apply to said secondary slurry a shear rate of $1.5 \times 10^6$ to $1.3 \times 10^7$ (1/s).

2. The method of production of the peeling layer paste as set forth in claim 1, performing said high pressure dispersion treatment by making the secondary slurry collide at 80 to 200 MPa pressure and 400 to 630 m/s flow rate.

3. The method of production of the peeling layer paste as set forth in claim 2, making the content of the binder in said primary slurry 7 parts or less by weight with respect to 100 parts by weight of said ceramic powder.

4. The method of production of the peeling layer paste as set forth in claim 1, making the content of the binder in said primary slurry 7 parts or less by weight with respect to 100 parts by weight of said ceramic powder.

5. A method of production of a peeling layer paste used for producing a multilayer electronic device,
   said method of production of a peeling layer paste having:
   a step of preparing a primary slurry containing a ceramic powder having an average particle size of 0.1 μm or less, a binder, and a dispersion agent and having a nonvolatile concentration of 30 wt % or more,
   a first high pressure dispersion treatment step of running said primary slurry through a wet jet mill to apply to said primary slurry a shear rate of $1.5 \times 10^6$ to $1.3 \times 10^7$ (1/s),
   a step of adding to the slurry after said first high pressure dispersion treatment a binder-lacquer solution to dilute the slurry after said first high pressure dispersion treatment and prepare a secondary slurry having a nonvolatile concentration of 15 wt % or less and a content of said binder of 12 parts by weight or more with respect to 100 parts by weight of said ceramic powder, and
   a second high pressure dispersion treatment step of running said secondary slurry through a wet jet mill again to apply to said secondary slurry a shear rate of $1.5 \times 10^6$ to $1.3 \times 10^7$ (1/s).

6. The method of production of the peeling layer paste as set forth in claim 5, performing said first and second high pressure dispersion treatments by causing collision of said primary slurry and secondary slurry at 80 to 200 MPa pressure and 400 to 630 m/s flow rate.

7. The method of production of the peeling layer paste as set forth in claim 4, making the content of the binder in said primary slurry 7 parts or less by weight with respect to 100 parts by weight of said ceramic powder.

8. The method of production of the peeling layer paste as set forth in claim 5, making the content of the binder in said primary slurry 7 parts or less by weight with respect to 100 parts by weight of said ceramic powder.

9. A method of production of a multilayer type electronic device having:
   a step of forming on a surface of a first support sheet a peeling layer of thickness of 0.2 μm or less, a step of forming an electrode layer on the surface of said peeling layer in a predetermined pattern, a step of forming a green sheet on the surface of said electrode layer to obtain a green sheet having an electrode layer, a step of stacking green sheets having said electrode layers to form a green chip, and a step of firing said green chip, wherein the peeling layer paste used for forming said peeling layer is the peeling layer paste produced by the method as set forth in claim 1.

10. A method of production of a multilayer type electronic device having:

a step of forming on a surface of a first support sheet a peeling layer of thickness of 0.2 μm or less, a step of forming an electrode layer on the surface of said peeling layer in a predetermined pattern, a step of forming a green sheet on the surface of said electrode layer to obtain a green sheet having an electrode layer, a step of stacking green sheets having said electrode layers to form a green chip, and a step of firing said green chip, wherein the peeling layer paste used for forming said peeling layer is the peeling layer paste produced by the method as set forth in claim 2.

11. A method of production of a multilayer type electronic device having:

a step of forming on a surface of a first support sheet a peeling layer of thickness of 0.2 μm or less, a step of forming an electrode layer on the surface of said peeling layer in a predetermined pattern, a step of forming a green sheet on the surface of said electrode layer to obtain a green sheet having an electrode layer, a step of stacking green sheets having said electrode layers to form a green chip, and a step of firing said green chip, wherein the peeling layer paste used for forming said peeling layer is the peeling layer paste produced by the method as set forth in claim 3.

12. A method of production of a multilayer type electronic device having:

a step of forming on a surface of a first support sheet a peeling layer of thickness of 0.2 μm or less, a step of forming an electrode layer on the surface of said peeling layer in a predetermined pattern, a step of forming a green sheet on the surface of said electrode layer to obtain a green sheet having an electrode layer, a step of stacking green sheets having said electrode layers to form a green chip, and a step of firing said green chip, wherein the peeling layer paste used for forming said peeling layer is the peeling layer paste produced by the method as set forth in claim 4.

* * * * *